(12) United States Patent
Gomez et al.

(10) Patent No.: US 12,494,367 B2
(45) Date of Patent: Dec. 9, 2025

(54) PRINTING COMPONENTS TO SUBSTRATE POSTS WITH GAPS

(71) Applicant: X-Celeprint Limited, Dublin (IE)

(72) Inventors: David Gomez, Holly Springs, NC (US); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 526 days.

(21) Appl. No.: 17/968,418

(22) Filed: Oct. 18, 2022

(65) Prior Publication Data

US 2023/0131998 A1 Apr. 27, 2023

Related U.S. Application Data

(60) Provisional application No. 63/270,469, filed on Oct. 21, 2021.

(51) Int. Cl.
*H01L 21/027* (2006.01)
*H01L 21/311* (2006.01)
*H01L 21/768* (2006.01)

(52) U.S. Cl.
CPC .... *H01L 21/0274* (2013.01); *H01L 21/31116* (2013.01); *H01L 21/76817* (2013.01); *H01L 21/7682* (2013.01); *H01L 21/76837* (2013.01); *H01L 21/76841* (2013.01)

(58) Field of Classification Search
CPC .......... H01L 21/0274; H01L 21/31116; H01L 21/76817; H01L 21/7682; H01L 21/76837; H01L 21/76841; H01L 24/16; H01L 2225/06513; H01L 2225/06555; H01L 2225/06593; H01L 25/0657

USPC ......................................................... 257/678
See application file for complete search history.

(56) References Cited

U.S. PATENT DOCUMENTS

| | | | |
|---|---|---|---|
| 7,622,367 B1 | 11/2009 | Nuzzo et al. |
| 7,943,491 B2 | 5/2011 | Nuzzo et al. |
| 8,506,867 B2 | 8/2013 | Menard |
| 8,722,458 B2 | 5/2014 | Rogers et al. |
| 8,889,485 B2 | 11/2014 | Bower |
| 10,103,069 B2 | 10/2018 | Bower et al. |
| 10,153,256 B2 | 12/2018 | Cok et al. |

(Continued)

OTHER PUBLICATIONS

Cok, R. S. et al., Inorganic light-emitting diode displays using micro-transfer printing, Journal of the SID, 25(10):589-609, (2017).

*Primary Examiner* — Caleen O Sullivan
(74) *Attorney, Agent, or Firm* — Choate, Hall & Stewart LLP; Michael D. Schmitt

(57) ABSTRACT

A printed structure includes a substrate comprising a substrate surface, a substrate circuit disposed in or on in a circuit area of the substrate surface, a substrate post protruding from the substrate surface exterior to the circuit area, and a component having a component top side and a component bottom side opposite the component top side. The component bottom side can be disposed on the substrate post and adhered to the substrate surface forming an air gap between the component bottom side and the substrate circuit. The substrate post can comprise a substrate post material that is a cured adhesive. Some embodiments comprise a substrate electrode and the component comprises an electrically conductive connection post extending from the component bottom side toward the substrate in electrical contact with the substrate electrode.

20 Claims, 18 Drawing Sheets

(56) References Cited

U.S. PATENT DOCUMENTS

| | | |
|---|---|---|
| 10,200,013 B2 | 2/2019 | Bower et al. |
| 10,224,460 B2 | 3/2019 | Bower et al. |
| 10,333,493 B2 * | 6/2019 | Nagarkar ............. H03H 9/1042 |
| 10,468,363 B2 | 11/2019 | Prevatte et al. |
| 10,790,173 B2 | 9/2020 | Gomez et al. |
| 11,482,979 B2 | 10/2022 | Trindade et al. |
| 11,528,808 B2 | 12/2022 | Gomez et al. |
| 12,074,583 B2 * | 8/2024 | Meitl ...................... B41F 16/00 |
| 2009/0051245 A1 * | 2/2009 | Takayama ............ H03H 9/1092 |
| | | 29/25.35 |
| 2016/0093600 A1 | 3/2016 | Bower et al. |
| 2017/0148771 A1 * | 5/2017 | Cha ...................... H10H 20/857 |
| 2022/0368306 A1 | 11/2022 | Meitl et al. |

* cited by examiner

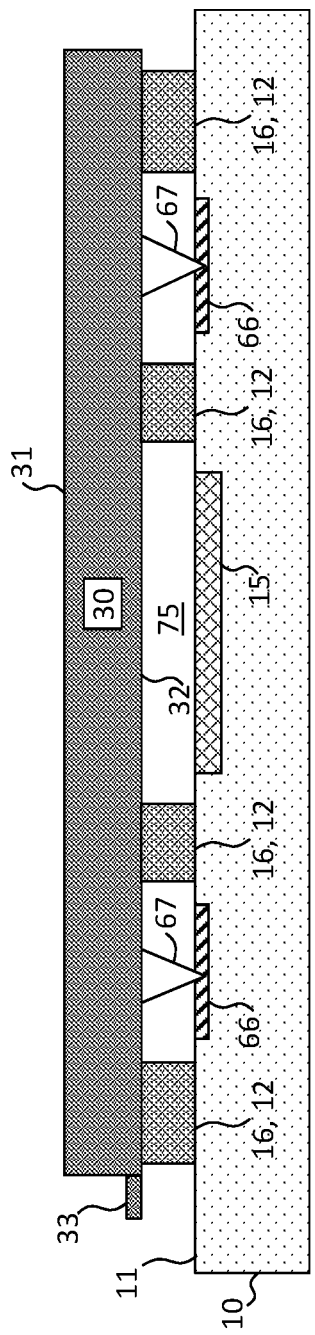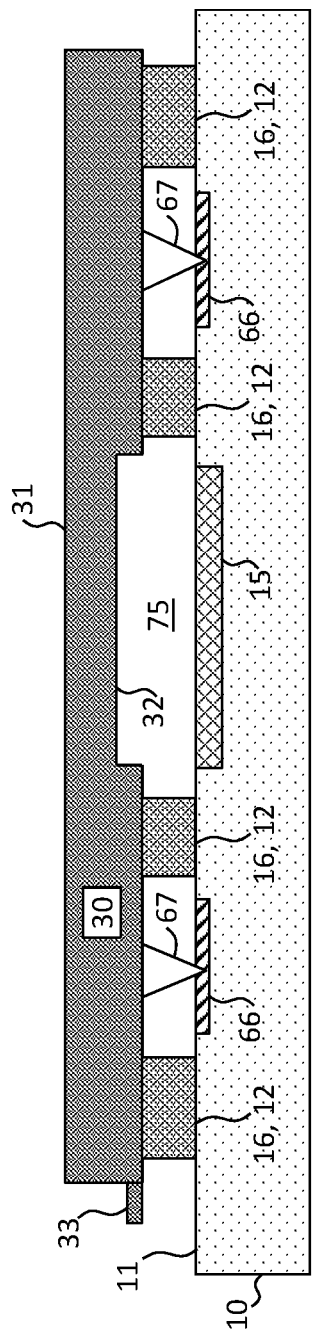

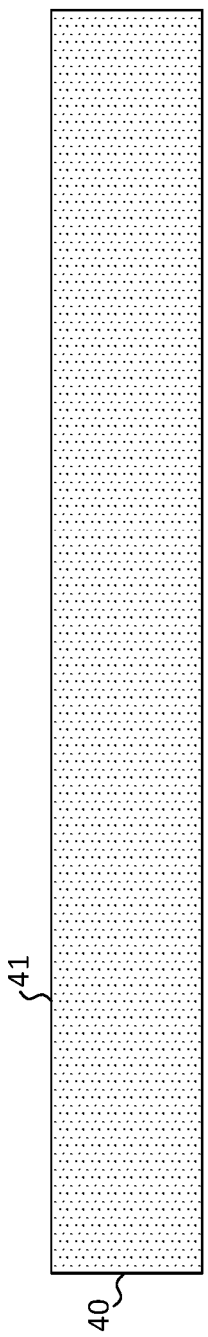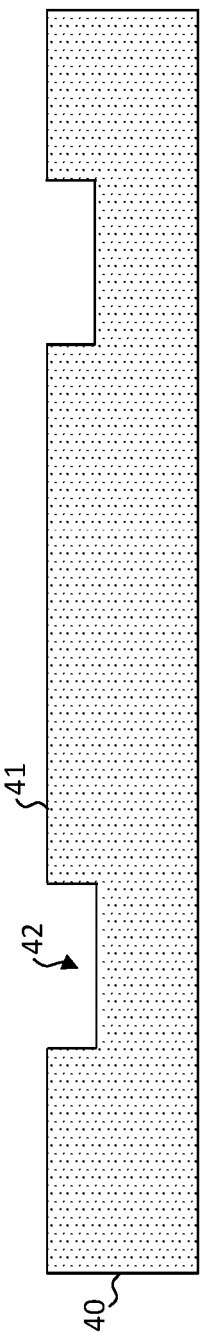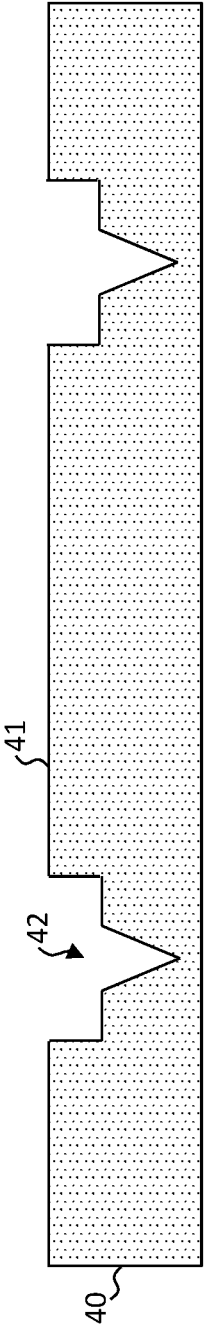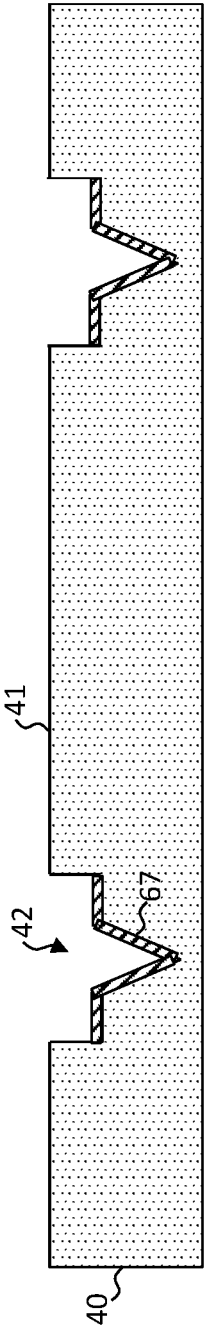

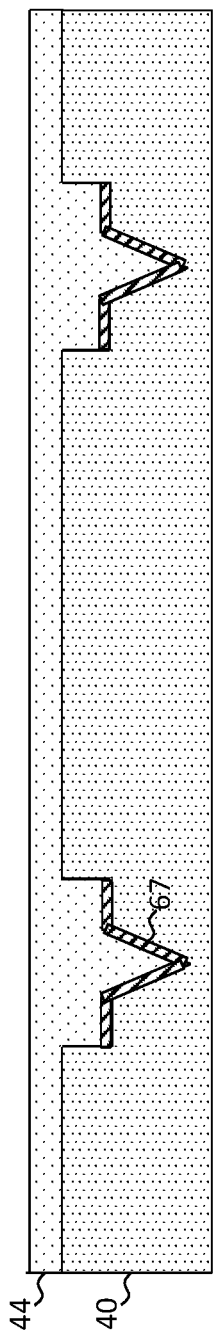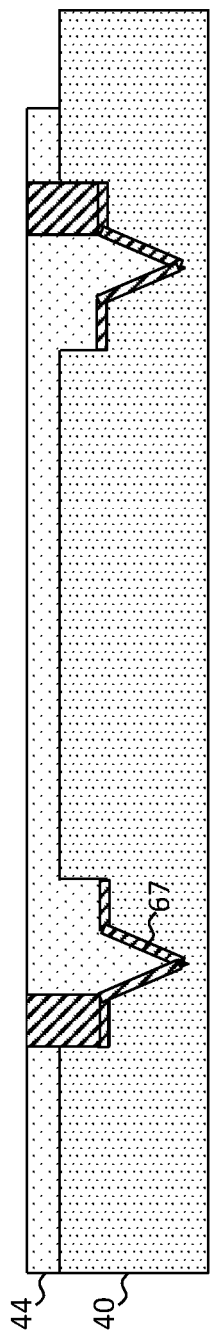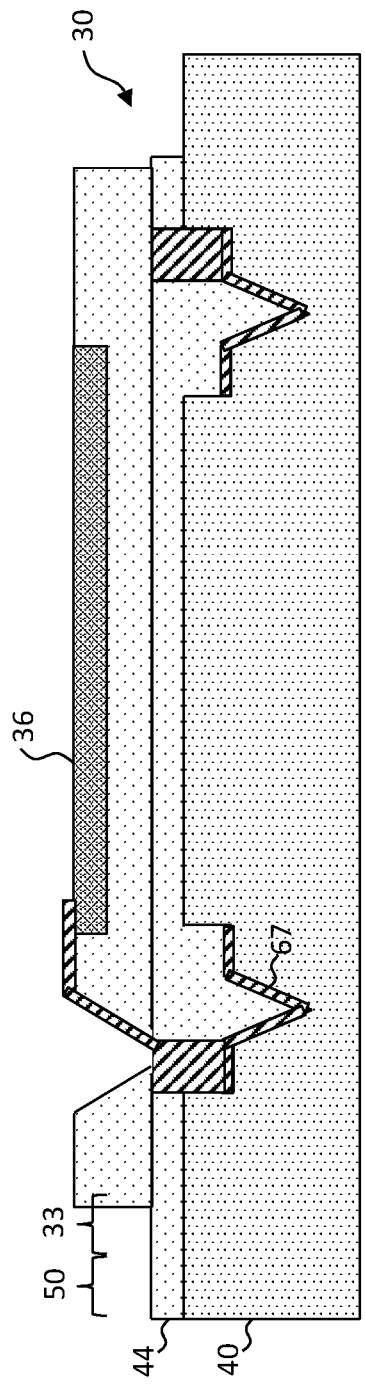

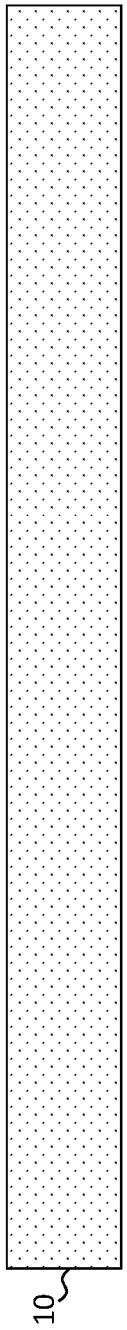
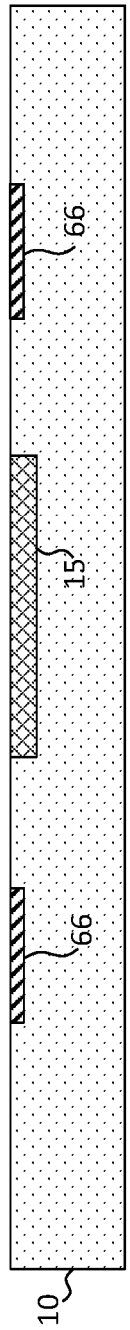
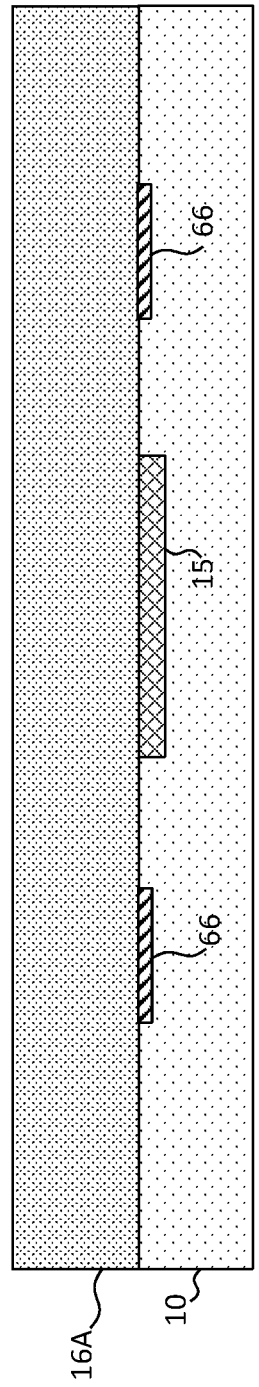
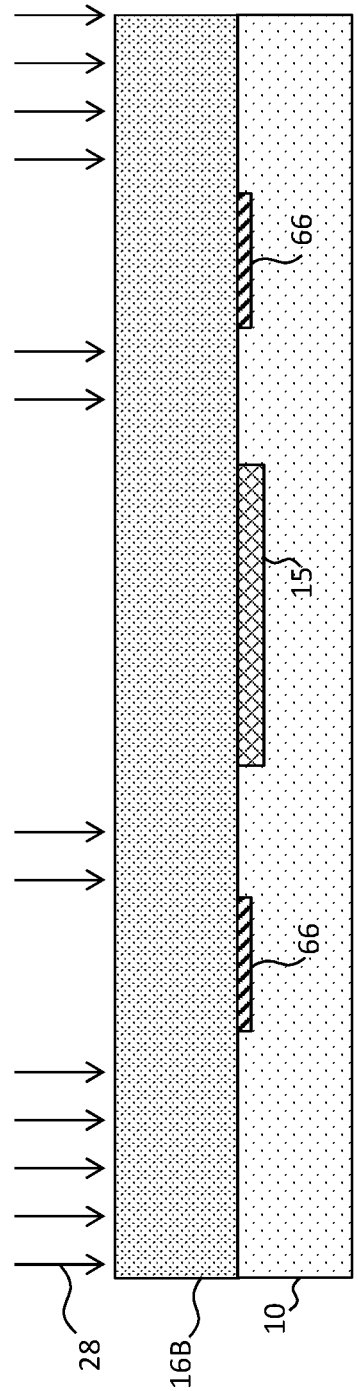

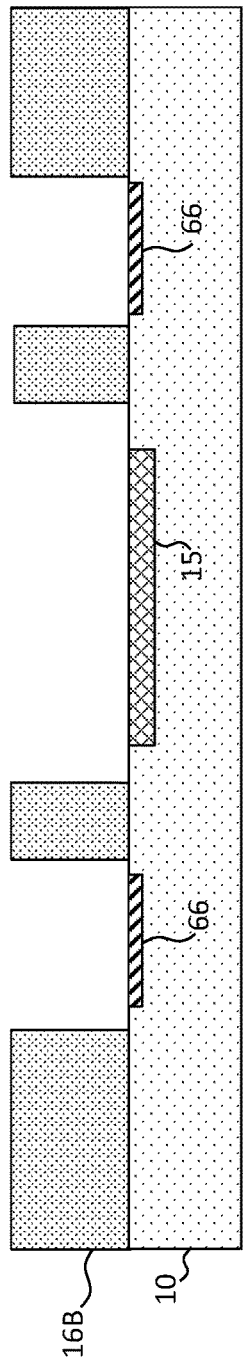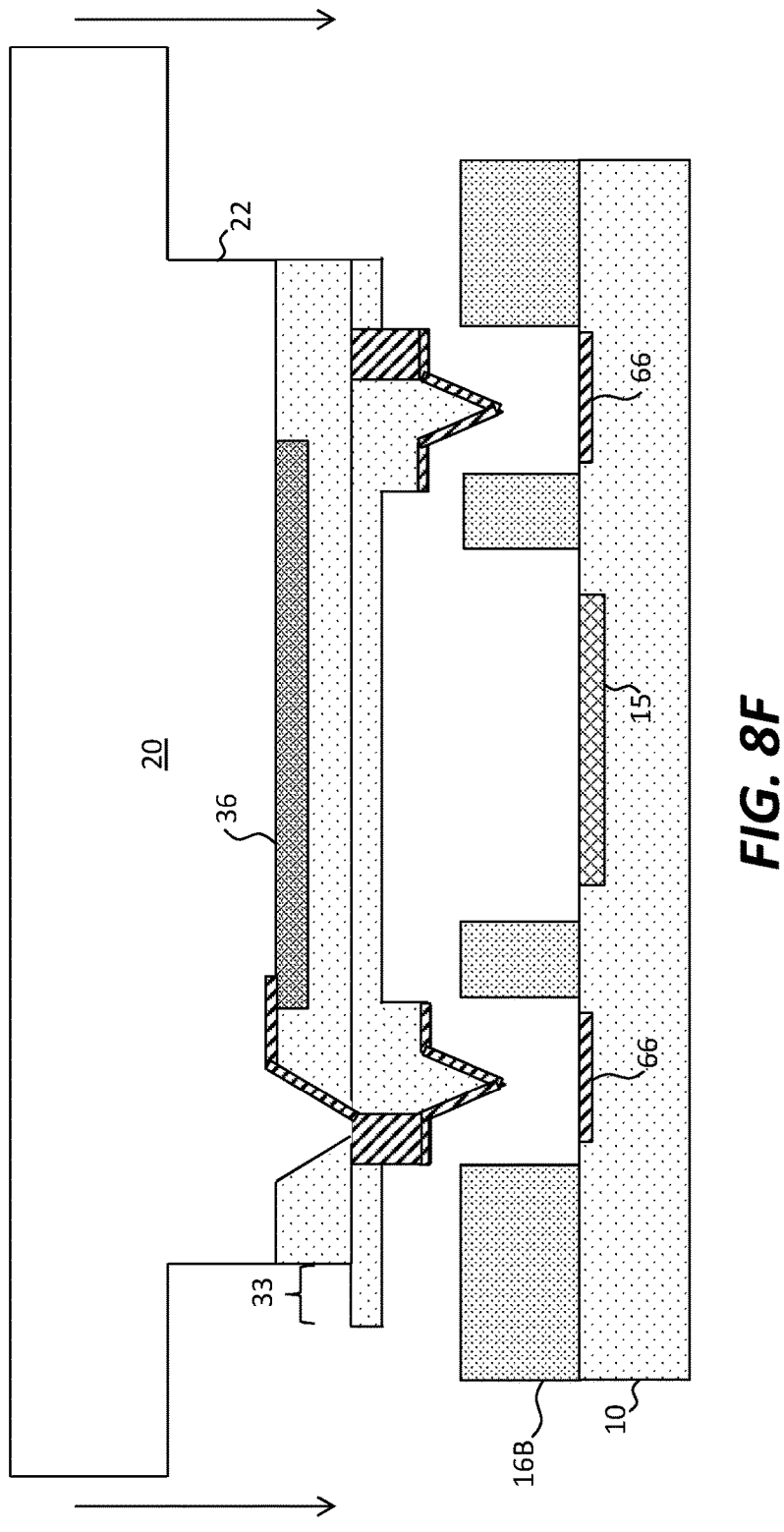

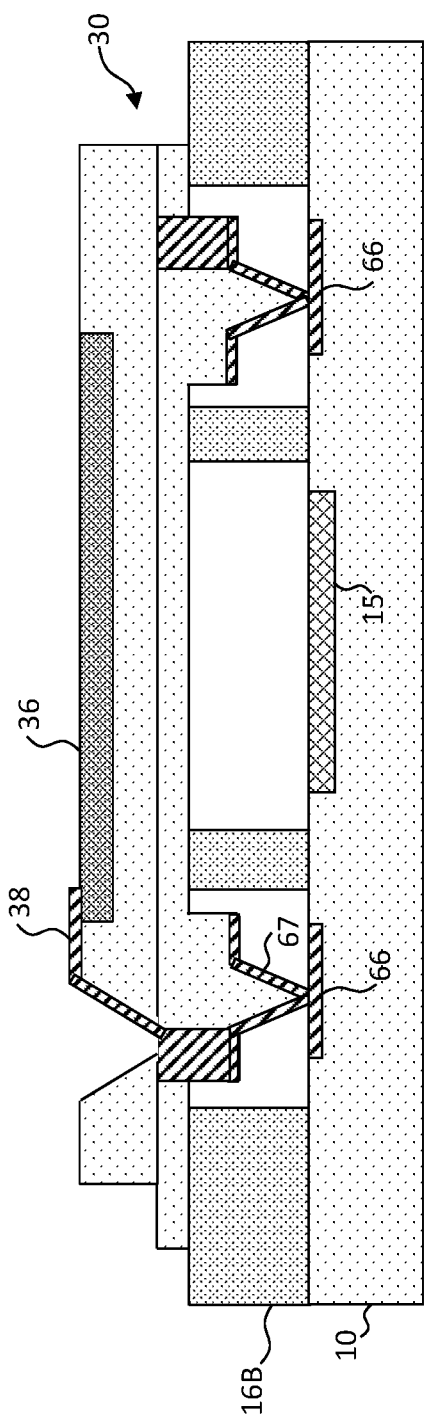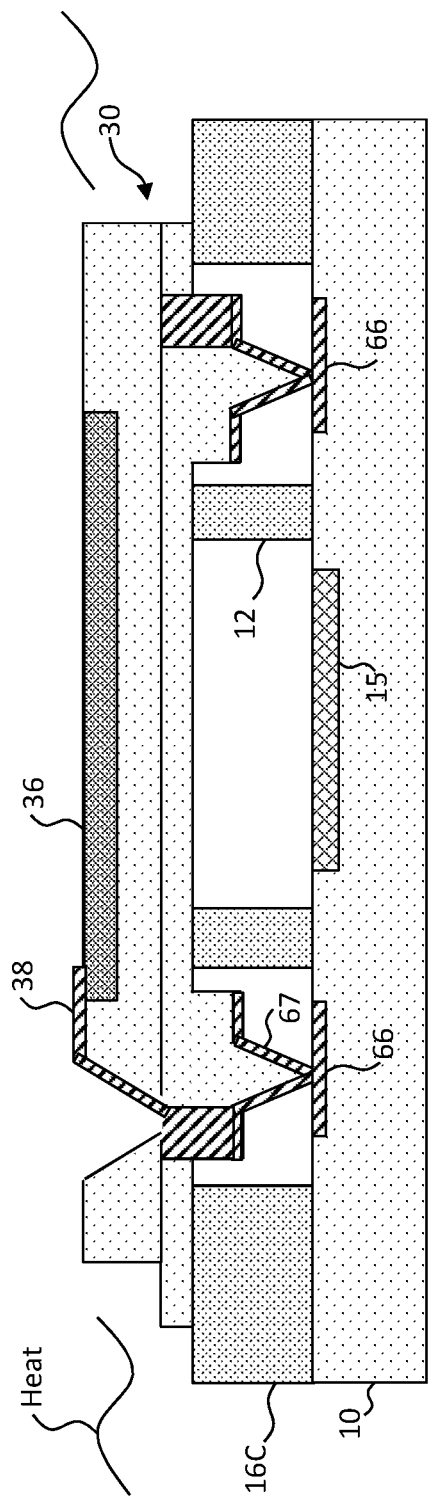

PRINTING COMPONENTS TO SUBSTRATE POSTS WITH GAPS

PRIORITY APPLICATION

This application claims the benefit of U.S. Provisional Patent Application No. 63/270,469, filed on Oct. 21, 2021, the disclosure of which is hereby incorporated by reference herein in its entirety.

TECHNICAL FIELD

The present disclosure relates generally to printed or printable structures including components and methods for disposing components on a substrate with an air gap.

BACKGROUND

Substrates with electronically active components distributed over the extent of the substrate may be used in a variety of electronic systems. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In some applications, for example high-frequency radio frequency (RF) circuits, it is desirable to leave the circuit free of contact with solid material adjacent to the circuit. The performance of RF circuits having a conductive or dielectric material coated over or on the RF circuit (e.g., in a highly integrated multilayer structure), can be inhibited by the presence of the conductive or dielectric material. There is a need, therefore, for circuit and assembly methods and structures that are integrated but do not have material in contact with high-frequency electronic circuits.

SUMMARY

The present disclosure provides, inter alia, structures, materials, and methods for providing air gaps in association with circuits on a substrate to avoid material being disposed directly on circuits (e.g., RF circuits). According to embodiments of the present disclosure, a printed structure comprise a substrate comprising a substrate surface, a substrate circuit disposed in or on in a circuit area of the substrate surface, a substrate post protruding from the substrate surface exterior to the circuit area, the substrate post comprising a substrate post material that is a cured adhesive, and a component having a component top side and a component bottom side opposite the component top side, the component bottom side disposed on the substrate post and thereby adhering the component to the substrate surface with the substrate post such that a gap is defined between the component bottom side and the substrate circuit. Some embodiments comprise a substrate electrode disposed in or on the substrate surface and the component comprises an electrically conductive connection post extending from the component bottom side toward the substrate in electrical contact with the substrate electrode.

In some embodiments, the substrate post is exterior to the substrate electrode. In some embodiments, the substrate post is exterior to the connection post.

Some embodiments comprise a cavity in the component bottom side that forms a portion of the gap.

In some embodiments, the substrate post comprises a soft-cured adhesive. In some embodiments, the substrate post comprises a hard-cured adhesive. In some embodiments, the cured adhesive at least partially surrounds the connection post. In some embodiments, the cured adhesive at least partially surrounds the substrate circuit. In some embodiments, the component is micro-transfer printed from a component source wafer to the substrate and comprises a broken (e.g., fractured) or separated component tether. In some embodiments, the component has a length or width no greater than 200 microns or a thickness no greater than 50 microns. In some embodiments, the component is a bare die.

In some embodiments, the substrate electrode is electrically connected to the substrate circuit.

In some embodiments, the adhesive comprises an organic material, a polymer, a resin, an epoxy, a positive photoresist, or a negative photoresist.

In some embodiments, the component comprises a dummy post and the adhesive is in contact with the dummy post.

In some embodiments, the gap is under vacuum. In some embodiments, the gap is filled with a gas (e.g., air).

In some embodiments, the printed structure further comprises a second adhesive substrate post protruding from the substrate surface exterior to the substrate circuit, the substrate post comprising a cured adhesive. In some embodiments, the second adhesive substrate post is disposed on an opposing end of the component bottom side of the component from the adhesive substrate post.

In some embodiments, the substrate circuit is an RF circuit.

According to embodiments of the present disclosure, a method of making a printed structure comprises providing (i) a component source wafer comprising a component and (ii) a transfer device, providing a substrate having one or more substrate circuits disposed thereon or therein and substrate posts made of soft-cured adhesive extending from a surface of the substrate exterior to the one or more substrate circuits, picking up the components from the component source wafer with the transfer device, printing the picked-up components to the substrate over the one or more substrate circuits by disposing the picked-up components onto the substrate posts, and, optionally, hard-curing the substrate posts thereby providing a printed structure comprising printed components adhered to the substrate surface with the substrate posts such that a gap is defined between each of the components and a respective one of the one or more substrate circuits.

According to embodiments of the present disclosure, a component source wafer comprises a source wafer having a source wafer surface and a hole in the source wafer extending from the source wafer surface into the source wafer, a connection post disposed in the hole, and a component disposed over the source wafer and electrically connected to the connection post. The source wafer can comprise a sacrificial layer over which the connection post and component are disposed, the sacrificial layer comprising sacrificial portions separated by anchors, the component physically connected to the anchor by a component tether. The component and connection posts can be disposed entirely over and directly above the sacrificial portion.

According to embodiments of the present disclosure, a method of making a component source wafer comprises providing source wafer, forming a trench (e.g., a hole, pit, or indentation) in the source wafer, forming a connection post in the trench, disposing a component on the source wafer, and electrically connecting the connection post to the source wafer.

According to embodiments of the present disclosure, a printed structure comprises a substrate comprising a substrate surface, a substrate circuit disposed in or on in a circuit area of the substrate surface, a substrate electrode disposed on or in the substrate surface, a component having a component top side and a component bottom side opposite the component top side, the component having a component cavity disposed in the component bottom side and the component is disposed on the substrate surface, and a component contact disposed on the component bottom side and in electrical contact with the substrate electrode. The component cavity can form an air gap between the component bottom side and the substrate circuit. In some embodiments, at least a portion of the component bottom side is in contact with at least a portion of the substrate surface.

In accordance with certain embodiments, a method of printing (e.g., micro-transfer printing) comprises providing a component source wafer comprising components, a transfer device, and a patterned substrate, wherein the patterned substrate comprises substrate posts that extend from a surface of the patterned substrate, picking up the components from the component source wafer by adhering the components to the stamp, and printing one or more of the picked-up components to the patterned substrate by disposing each of the one or more picked-up components onto one of the substrate posts, thereby providing one or more printed components in a printed structure (e.g., a micro-transfer printed structure) comprising an air gap between each component and a substrate circuit disposed on a surface of the patterned substrate. In some embodiments, the transfer device is a stamp, for example comprising a viscoelastic material such as PDMS, or an electro-static transfer device. The components can be adhered to the substrate posts, for example with van der Waals forces or with an adhesive layer.

In some embodiments, each of the picked-up components comprises a broken (e.g., fractured) or separated component tether.

According to some embodiments, the transfer device is a stamp comprising a stamp post, one of the picked-up components is disposed on the stamp after being picked up, and the stamp post has a dimension substantially the same as a corresponding dimension of at least one of the substrate posts.

In some embodiments, the component has at least one of a length and a width less than or equal to 200 microns, less than or equal to 100 microns, less than or equal to 50 microns, less than or equal to 20 microns, less than or equal to 10 microns, or less than or equal to 5 microns. The component material can be a semiconductor. The substrate post material can be a dielectric.

The component can be adhered or attached to the patterned substrate only by the component bottom side. The component can be an electronic or an opto-electronic component and can comprise an active or passive electrical circuit. The component can be responsive to at least one of electrical energy, optical energy, electromagnetic energy, and mechanical energy. The component can comprise electrically conductive connection posts.

In some embodiments, the patterned substrate is a semiconductor substrate (e.g., a compound semiconductor substrate) comprising an electronic substrate circuit.

In some embodiments, the substrate is patterned to form a patterned substrate with one or more substrate post(s). The component can be printed (e.g., micro-transfer printed) from a component source wafer onto the substrate post(s).

In some embodiments, providing the component comprises providing a component source substrate, disposing the component over or on the component source substrate, providing a sacrificial layer over at least a portion of the component, adhering the sacrificial layer to a carrier substrate with an adhesive, and removing the component source substrate and exposing at least a portion of the sacrificial layer. Providing the sacrificial layer can comprise forming the sacrificial layer. Embodiments can comprise forming at least one of the one or more component electrodes on the component before forming the sacrificial layer, forming a component electrode on the component after removing the component source substrate, etching the sacrificial layer to form a component tether attaching the component to an anchor portion of the adhesive, or printing (e.g., micro-transfer printing) the component.

In some embodiments, the component has a component top side and a component bottom side opposite the component top side and the component comprises a component top electrode disposed on the component top side. The component top electrode can be electrically connected to a connection post, for example through a via in the component.

In some embodiments, a device structure comprises a dielectric layer disposed at least partially between a component substrate and a distal end of a connection post. The connection posts can have a distal end and a proximal end, the distal end having an area smaller than an area of the proximal end, wherein the distal end forms a sharp point. The connection posts can comprise planar edges or a pyramidal structure. The connection posts can be disposed closer to an edge or a corner of the component than to a center of the component.

In some embodiments, a device structure comprises a component source wafer comprising a sacrificial layer comprising sacrificial portions, wherein each sacrificial portion is adjacent to one or more anchors. The component can be disposed entirely, completely, or exclusively over one of the sacrificial portions. In some embodiments, the components can comprise portions that extend over or form part of a tether or anchor. In some embodiments, the component source wafer comprises trenches, pits, indentations, or holes in which connection posts are disposed.

In some embodiments, the component comprises a cavity on a bottom side of the component adjacent to the component source wafer.

In some embodiments, a printed structure comprises a substrate having a substrate surface, substrate electrodes (e.g., substrate contact pads) disposed on the substrate surface, and a component disposed on the substrate surface.

Each of the connection posts can be in electrical contact with one of the substrate electrodes. In some embodiments, the component comprises a cavity on a bottom side of the component adjacent to the substrate surface.

In some embodiments, a printed structure comprises a patterned layer of adhesive adhering the connection posts to the substrate surface. The patterned layer of adhesive can contact only a portion of a bottom surface of the component to the substrate surface. The component can have at least one of a length and width less than or equal to 200 microns. The patterned substrate can comprise a semiconductor comprising an electronic substrate circuit.

In some embodiments, a device structure comprises three or at least four connection posts or more than one substrate circuit. The component can comprise at least a portion of a component tether.

According to some embodiments of the present disclosure, a printed structure comprises a patterned substrate comprising a substrate surface and a substrate post protruding from the substrate surface. The substrate post comprises a substrate post material that is an adhesive, for example a hard-cured adhesive, a partially cured or soft-cured adhesive, or a liquid adhesive. A component has a component top side and a component bottom side opposite the component top side. The component bottom side is disposed on and adhered to the substrate post.

The adhesive can be a cured adhesive, an uncured adhesive, a partially cured adhesive, or a soft-cured adhesive. The adhesive can be a curable adhesive that is only partially cured. The adhesive can comprise an organic material, a polymer, a resin, or an epoxy. The adhesive can be a photoresist. The photoresist can be a positive photoresist or a negative photoresist.

According to some embodiments, the patterned substrate comprises a plurality of substrate posts disposed in an adhesive layer forming the pattern of the patterned substrate. According to some embodiments, one or more substrate posts form rings around one or more of the substrate electrodes or connection posts. According to some embodiments, one or more substrate posts form rings around one or more of the substrate circuits.

According to some embodiments, the printed structure comprises one or more connection posts extending from the component toward the patterned substrate. Substrate electrodes can be disposed on the patterned substrate adjacent to the substrate post and each of the connection posts can be in electrical contact with one of the substrate electrodes. According to some embodiments, the adhesive is disposed between the component and the substrate. According to some embodiments, the adhesive is disposed only between the connection posts and the substrate circuit and is not in contact with the connection posts or the substrate circuit so that none of the adhesive is disposed on the substrate electrodes or substrate circuit. According to some embodiments of the present disclosure, the connection posts extend into or penetrate (e.g., pierce) the electrical substrate electrodes to make an electrical contact between the component and the substrate electrodes. A height of the connection posts can be greater than or equal to the height of the substrate post. According to some embodiments, (i) the components comprise connection posts extending towards the patterned substrate, (ii) the patterned substrate comprises substrate electrodes disposed between the substrate posts, and (iii) the substrate posts each have a height greater than or equal to a height of connection posts when uncured or soft-cured and subsequently a smaller height that is less than or equal to a height of connection posts after hard curing when the connection posts are in electrical contact with the substrate electrodes.

According to some embodiments, the substrate electrodes are substantially planar and the component contact pads have a substantially planar distal end.

According to some embodiments of the present disclosure, solder is disposed on the substrate electrodes and the solder coats at least a portion of the connection posts. According to some embodiments, a non-directional deposition of metal coats both the connection posts and the substrate electrodes, for example by chemical vapor, electroless plating, or electroplating. According to some embodiments, the connection posts are wave soldered. Heating and then cooling the solder can physically connect each of the connection posts to one of the substrate electrodes.

According to some embodiments of the present disclosure, the adhesive holds the component in compression against the substrate.

According to some embodiments of the present disclosure, the component comprises a fractured, broken, or separated tether, for example as a consequence of micro-transfer printing the component from a component source wafer to the substrate post.

According to some embodiments of the present disclosure, a method of making a printed structure comprises providing a component source wafer comprising components and a transfer device, providing a substrate, disposing a layer of adhesive on the substrate (e.g., a curable liquid layer of adhesive), and patterning the layer of adhesive to form soft-cured substrate posts that extend from a surface of the patterned substrate, picking up the components from the component source wafer by adhering the components to the transfer device, and printing one or more of the picked-up components to the patterned substrate by disposing each of the one or more picked-up components onto one of the substrate posts, thereby providing one or more printed components in a printed structure. The substrate posts can be hard-cured, for example by heating. According to some embodiments, the adhesive layer is a negative photoresist. In some embodiments the adhesive layer is a positive photoresist. The photoresist can patterned by exposure through a mask, for example a mask disposed over the substrate. The layer of adhesive can be hard-cured and the patterned substrate can be wave soldered after the hard cure to form or improve an electrical connection between the connection posts and the substrate electrodes. Substrate electrodes can be substrate contact pads. According to some embodiments, electrical connection between the connection posts and the substrate electrodes are enhanced by a non-directional metal deposition such as by chemical vapor, electroless plating, or electroplating.

Some embodiments of the present disclosure comprise soft curing the adhesive layer, patterning the adhesive layer to form substrate posts, printing each picked-up component of the one or more of the picked-up components onto the substrate posts, and hard curing the patterned adhesive layer. Connection posts can extend from the component, the substrate can comprise substrate electrodes coated with solder, and methods of the present disclosure can comprise heating and cooling the solder to electrically connect each substrate electrode to one of the connection posts. Heating and cooling the solder can hard-cure the adhesive in a common step.

According to some embodiments, providing the patterned substrate comprises providing a substrate and printing the substrate posts onto the substrate in a pattern thereby forming the patterned substrate, for example by inkjet printing.

In some embodiments, a printed structure comprises a component suspended over a substrate circuit, the substrate circuit disposed in or on a surface of a substrate, by one or more adhesive substrate posts protruding from the substrate surface thereby defining a gap between the component and the substrate circuit. In some embodiments, the one or more adhesive substrate posts are cured. In some embodiments, a gap is defined between the component and the substrate circuit and the gap is filled with a gas (e.g., air). In some embodiments, a gap is defined between the component and the substrate circuit and the gap is under vacuum. In some embodiments, the one or more adhesive substrate posts are each disposed outside a perimeter of the substrate circuit. In some embodiments, the one or more adhesive substrate posts are exterior to the substrate circuit. In some embodiments, no more than 20% (e.g., no more than 10%) of the substrate circuit is covered by the one or more adhesive substrate posts.

In some embodiments, a printed structure comprises a component adhered to a substrate with a patterned adhesive layer and a substrate circuit disposed in or on the substrate, wherein none of the patterned adhesive layer is disposed between the component and the substrate circuit. In some embodiments, the patterned adhesive layer comprises a plurality of substrate posts.

In some embodiments, a printed structure comprises a component adhered to a substrate with a patterned adhesive layer and a substrate circuit disposed in or on the substrate, wherein no more than 20% (e.g., no more than 10% or none) of the substrate circuit is covered by the patterned adhesive layer.

In some embodiments, a method of making a printed structure comprises providing a substrate having one or more substrate circuits disposed on or in a substrate surface of the substrate and one or more adhesive substrate posts protruding from the substrate surface, printing one or more components from a component source wafer onto the one or more adhesive substrate posts, and hard-curing the one or more substrate posts thereby providing one or more printed components adhered to the substrate surface with the one or more substrate posts such that a gap is defined between each of the one or more components and a respective one of the one or more substrate circuits.

According to some embodiments, the adhesive is curable and the methods of the present disclosure comprise curing (e.g., hard curing) the substrate posts after the printing. Substrate posts can have a smaller height after curing.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1 and 2 are cross sections of printed structures with air gaps according to illustrative embodiments of the present disclosure;

FIGS. 7A-7J are successive illustrations of structures formed during a method according to illustrative embodiments of the present disclosure;

FIGS. 8A-8J are successive illustrations of structures formed during a method according to illustrative embodiments of the present disclosure;

Figure 3:
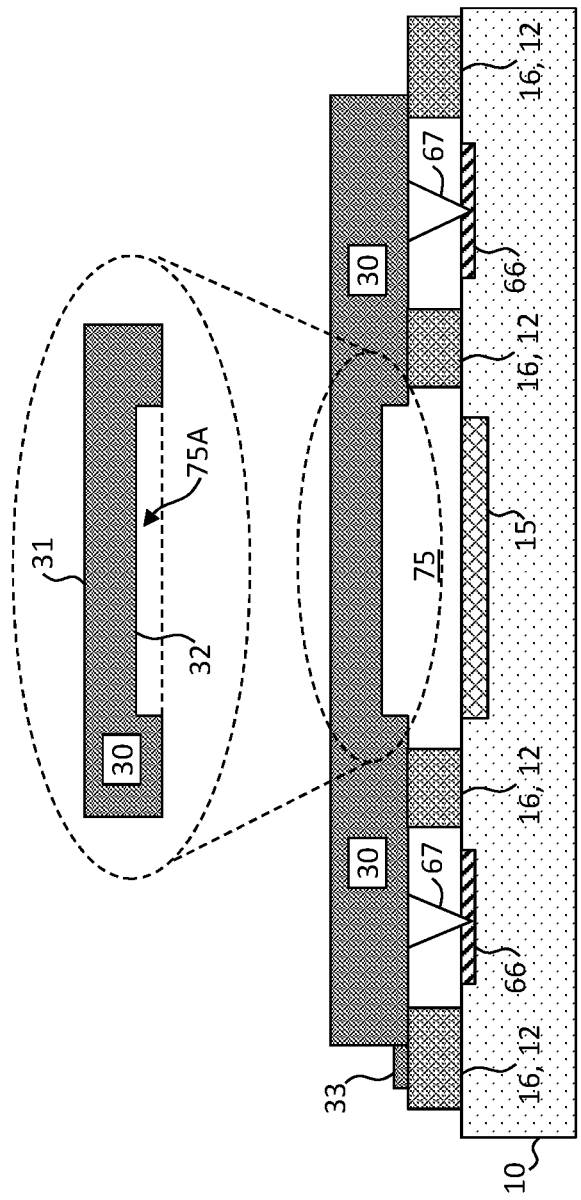
FIG. 3 is a cross section and detail of FIG. 2 according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale. The vertical scale of the Figures can be exaggerated to clarify the illustrated structures.

DETAILED DESCRIPTION OF CERTAIN EMBODIMENTS

Electronic circuit performance and density are important attributes of electronic systems. However, very small and dense electronic circuits are increasingly difficult and expensive to construct. One approach to increasing circuit density is to construct circuits in three dimensions, for example stacked on or over a substrate. However, the performance of some high-frequency electronic circuits, for example radio frequency (RF) circuits, are inhibited, degraded, compromised, or prevented by the presence of metal or dielectric materials or layers in close proximity to the high-frequency electronic circuits. Such materials and layers are typically found in three-dimensional photolithographic constructs used in integrated circuits and can therefore deleteriously affect high-frequency electronic circuits. There is, therefore, a need for three-dimensional integrated circuit structures that are compatible with such high-frequency electronic circuits. Embodiments of the present disclosure enable three-dimensional circuit structures disposed on a substrate in which a gap (e.g., an air gap or gap filled with other gas) is present between the substrate and the three-dimensional structures. A substrate circuit can be disposed on or in the substrate and the air gap disposed adjacent to or on or over the substrate circuits in a direction opposite the substrate.

According to embodiments of the present disclosure and as illustrated in FIGS. 1 and 2, a printed structure comprises a substrate 10 comprising a substrate surface 11, a substrate circuit 15 disposed in or on the substrate surface 11, a substrate post 12 protruding from substrate surface 11 exterior to the substrate circuit, substrate post 12 comprising a substrate post material that is a cured adhesive 16, and a component 30 having a component top side 31 and a component bottom side 32 opposite the component top side 31, component bottom side 32 disposed on or in contact with substrate post 12 and adhered to substrate surface 11 forming a gap 75 between component bottom side 32 and substrate circuit 15. As illustrated in FIG. 1, component bottom side 32 can be substantially planar. As illustrated in FIG. 2, component bottom side 32 can have a cavity (e.g., a component gap 75A) formed therein that increases the size of air gap 75. FIG. 3 illustrates the air gap 75 structure in more detail, showing the cavity forming component air gap 75A in the component bottom side 32. The depth and volume of gap 75 can be controlled by the height (depth) of substrate posts 12 or component gap 75A, or both.

Component 30 can be any structure useful in combination with substrate 10, for example an active or passive integrated circuit. Component 30 can comprise any one or more of a combination of semiconductor, conductive metals, or dielectric materials, such as inorganic oxides (e.g., silicon oxide), nitrides (e.g., silicon nitride), or organic materials such as resins or epoxies. Components 30 can be constructed using photolithographic methods and materials known in the art. Substrate 10 can be any useful substrate on or in which substrate circuit 15 can be disposed or formed, for example glass, polymer, semiconductor, or compound semiconductor materials as found in the integrated circuit industry. If substrate circuit 15 is native to and formed in or on substrate 10, compound semiconductor substrate 10 materials are useful because they can provide semiconductor materials useful in high-frequency electronic circuits, for example GaAs, GaN, InP and other III/V or II/VI compound semiconductor materials. If substrate circuit 15 is not native to substrate 10, substrate circuit 15 can be an integrated circuit formed in a source wafer and disposed on substrate 10 as a bare die, for example by micro-transfer printing, and substrate circuit 15 integrated circuit can comprise a broken (e.g., fractured) or separated tether in consequence. Substrate circuit 15 can be an integrated circuit formed using photolithographic methods and materials known in the art. Substrate post 12 can be an adhesive 16, for example an organic material such as a soft- or hard-cured adhesive 16B, 16C (or a soft- or hard-curable adhesive), such as a polymer, an epoxy, a resin, or a positive or negative photoresist. As used herein, a cured adhesive 16 is an adhesive 16 that is at least partially but not necessarily completely cured. For example, a substrate post 12 adhesive material can be coated as a liquid (e.g., a liquid adhesive 16A) over substrate 10, partially cured (e.g., thereby forming a soft-cured adhesive 16B), patterned, and then hard cured (e.g., thereby converting the soft-cured adhesive 16B into a hard-cured adhesive 16C) using photolithographic processes, as discussed further below. In some embodiments, an adhesive substrate post 12 comprises adhesive 16 that is hard-cured without first soft-curing (e.g., may be disposed originally in a semi-solid or solid state instead of a liquid state). Thus, substrate posts 12 can be formed by patterning a layer of adhesive 16. It may also be said that a layer of patterned adhesive 16 may comprise one or more substrate posts 12 comprising adhesive. A gap 75 may be filled with gas, such as air (e.g., ambient air), or be under vacuum. A gap 75 may be filled with air by nature of the manufacturing method (e.g., without intentionally introducing air into gap 75).

In some embodiments, substrate posts 12 adhere substrate 10 to component 30. Substrate posts 12 can be exterior to substrate circuit 15. By exterior to is meant that substrate post 12 is not disposed over substrate circuit 15 (e.g., with substrate circuit 15 disposed between substrate 10 and substrate post 12) or disposed directly between substrate circuit 15 and component 30, but rather laterally to a side of substrate circuit 15 on substrate 10 (e.g., substrate surface 11). Thus, substrate posts 12 serve as a standoff for component 30 from substrate 10, forming an air gap 75 between component 30 and substrate 10. Thus, substrate 10 can be a patterned substrate. Air gap 75 can have no solid material therein.

In embodiments of the present disclosure and as shown in FIGS. 1-3, component 30 can be an active or passive electronic component (e.g., an integrated circuit) that is electrically connected to substrate 10, for example electrically connected to substrate circuit 15 through substrate electrodes 66 disposed on substrate surface 11. Substrate electrodes 66 can be or comprise an electrical substrate contact pad 66. Components 30 can comprise electrically conductive connection posts 67 that extend (e.g., protrude) from component bottom side 32 toward substrate 10 in electrical contact with substrate electrode 66. Connection posts 67 can contact or pierce substrate electrode 66 to make an electrical connection and substrate electrode 66 can be electrically connected to substrate circuit 15, for example with wires or metal traces (not shown in FIGS. 1-3), thus connecting any circuit in component 30 with substrate circuit 15. Substrate electrodes 66 can be metal or other electrical conductors and can be formed using photolithographic materials and methods known in the art.

Connection posts 67 can be pyramidal or have a triangular cross section and have a sharp point. Connection posts 67 can be coated metal over a dielectric structure and can be connected with vias (for example through-silicon or through-dielectric vias) through a component 30 substrate to a component circuit 36 formed in component 30 with a component top electrode 38.

Component 30 can be disposed on substrate 10 by micro-transfer printing component 30 from a component source wafer 40, as described further below. In consequence of micro-transfer printing, component 30 can comprise a broken (e.g., fractured) or separated component tether 33, for example as shown in FIGS. 1-3. Components 30 can be relatively small devices, for example having a length or width, or both, no greater than 200 microns, no greater than 100 microns, no greater than 50 microns, no greater than 20 microns, or no greater than 10 microns or, alternatively or additionally, a thickness no greater than 50 microns, no greater than 20 microns, no greater than 10 microns, no greater than 5 microns, or no greater than 3 microns.

Figure 4:
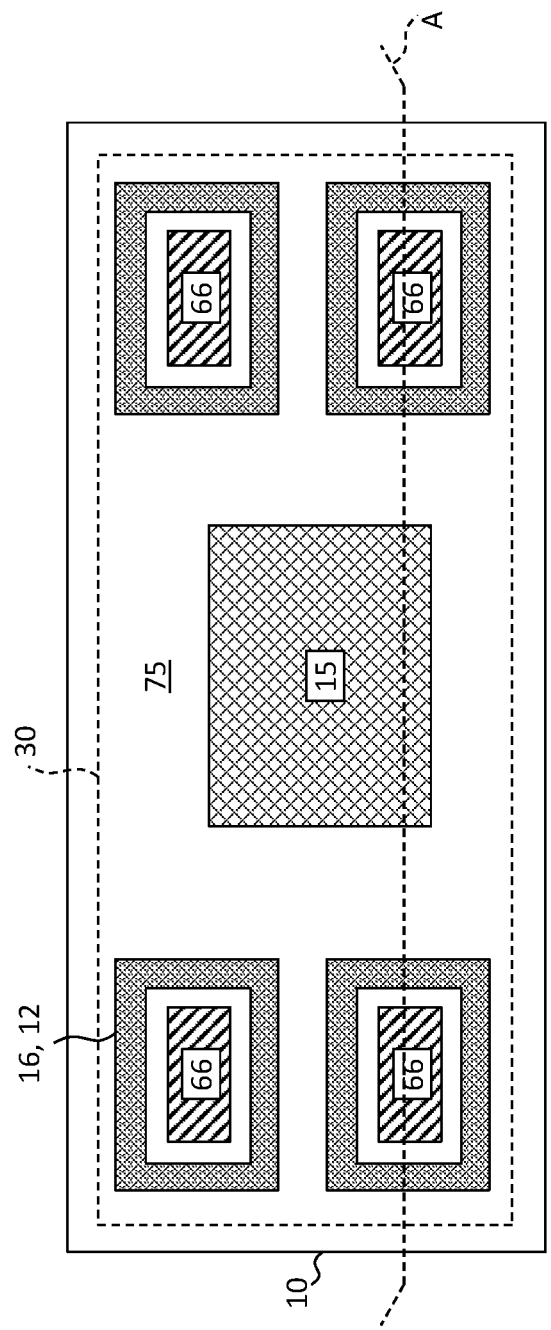
FIGS. 4 and 5 are plan views of printed structures according to illustrative embodiments of the present disclosure.
Figure 5:
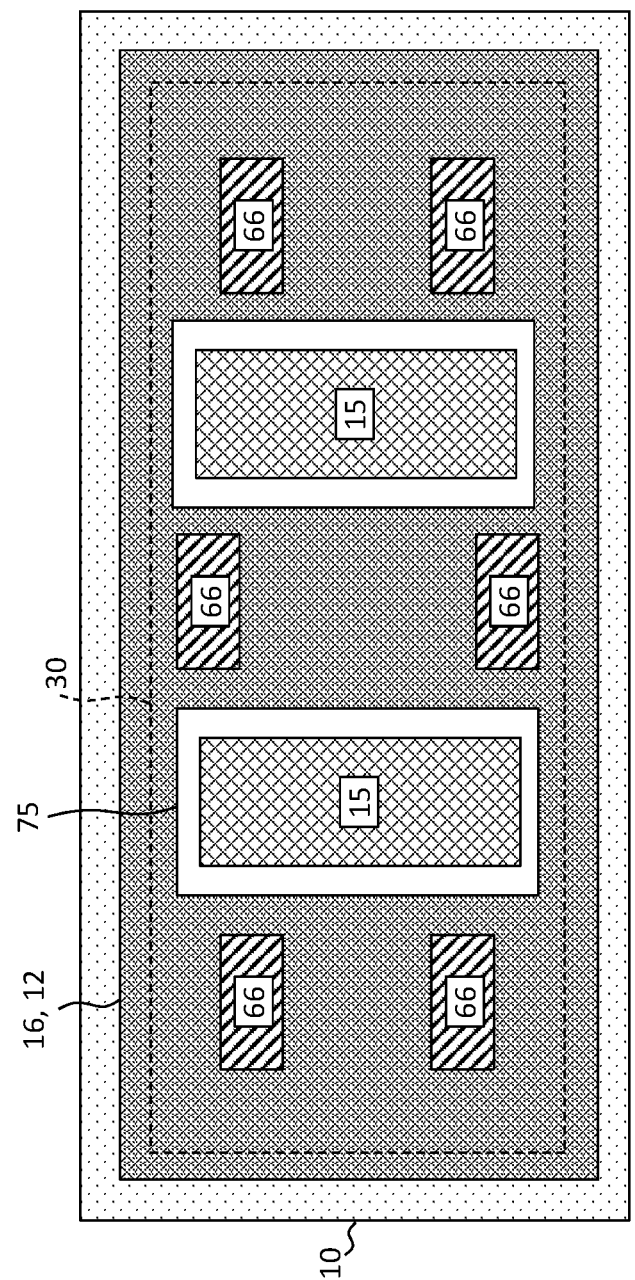

Substrate posts 12 can be exterior to substrate electrodes 66 or connection posts 67 so that substrate posts 12 do not contact substrate electrodes 66 or connection posts 67 and are not disposed between component 30 and substrate electrodes 66 or between connection posts 67 and substrate 10. In some embodiments, one or more substrate posts 12 are exterior to circuit substrate 15 but not substrate electrodes 66 or connection posts 67 (or both) while one or more other substrate posts 12 are exterior to circuit substrate 15 and also substrate electrodes 66 or connection posts 67 (or both). FIGS. 1 and 2 illustrate examples of such arrangements. In some embodiments, substrate posts 12 surround, e.g., form a ring (e.g., a polygonal ring) around, any one or more of substrate circuit 15, connection post(s) 67, and substrate electrode(s) 66, as shown in FIGS. 4 and 5. In some embodiments, a substrate post 12 at least partially surrounds one or more of substrate circuit 15, connection post(s) 67, and substrate electrode(s) 66. In some embodiments, multiple substrate posts 12 adhere a single component 30 to substrate 10, for example different substrate posts 12 can be disposed at different ends of component 30 on component bottom side 32 between component 30 and substrate 10 (e.g., if each rectangular cross section of substrate post(s) 12 in FIGS. 1 and 2 corresponded to a distinct discrete substrate post 12). In some embodiments, a printed structure resembles FIGS. 1 and 2 but with one or more of the substrate post(s) 12 not present, for example, such that there are two substrate posts 12 at opposing ends of component bottom side 32 exterior to circuit substrate 15 and interior to connection posts 67 and substrate electrodes 66 (if present). FIGS. 4 and 5 are plan views of substrate 10 with component 30 indicated with a dashed rectangle. As shown, printed structures of the present disclosure can comprise multiple substrate electrodes 66 and multiple substrate circuits 15 (as shown in FIG. 5). Cross section line A corresponds to the cross sections of FIGS. 1-3. In FIG. 4, a majority of the area of substrate surface 11 is free of substrate posts 12 forming a relatively large gap 75 between component 30 and substrate circuit 15. In FIG. 5, a majority of the area of substrate surface 11 is covered with substrate posts 12 (or forms a single large substrate post 12) forming a relatively smaller gap 75 between component 30 and substrate circuit 15.

Figure 6:
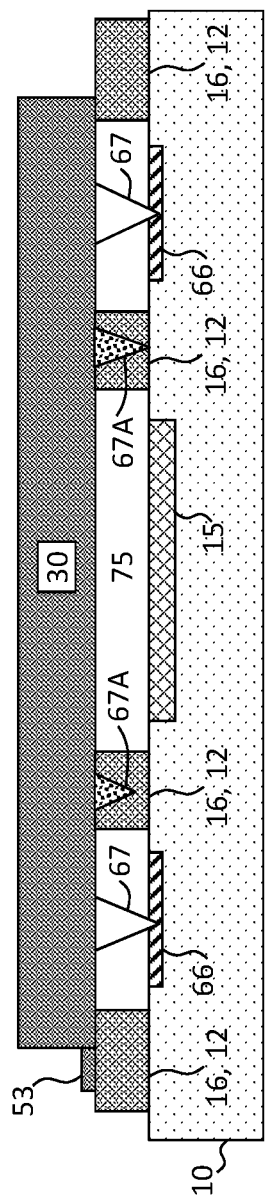
FIG. 6 is a plan view of printed structures with air gaps and dummy posts according to illustrative embodiments of the present disclosure.

As shown in FIG. 6 and according to embodiments of the present disclosure, component 30 can comprise one or more dummy posts 67A. Such dummy posts 67A can be in contact with adhesive 16 (e.g., in contact with substrate post 12) and increase the adhered area of component 30, increasing the bond strength of adhesive 16, without needing to increase cross sectional area of substrate posts 12. Dummy posts 67A can be shorter than connection posts 67 or the same length, as shown in FIG. 6. Dummy posts 67A can be the same or different shape from connection posts 67 (e.g., pyramidal or cylindrical or rectangular solid).

Figure 7H:
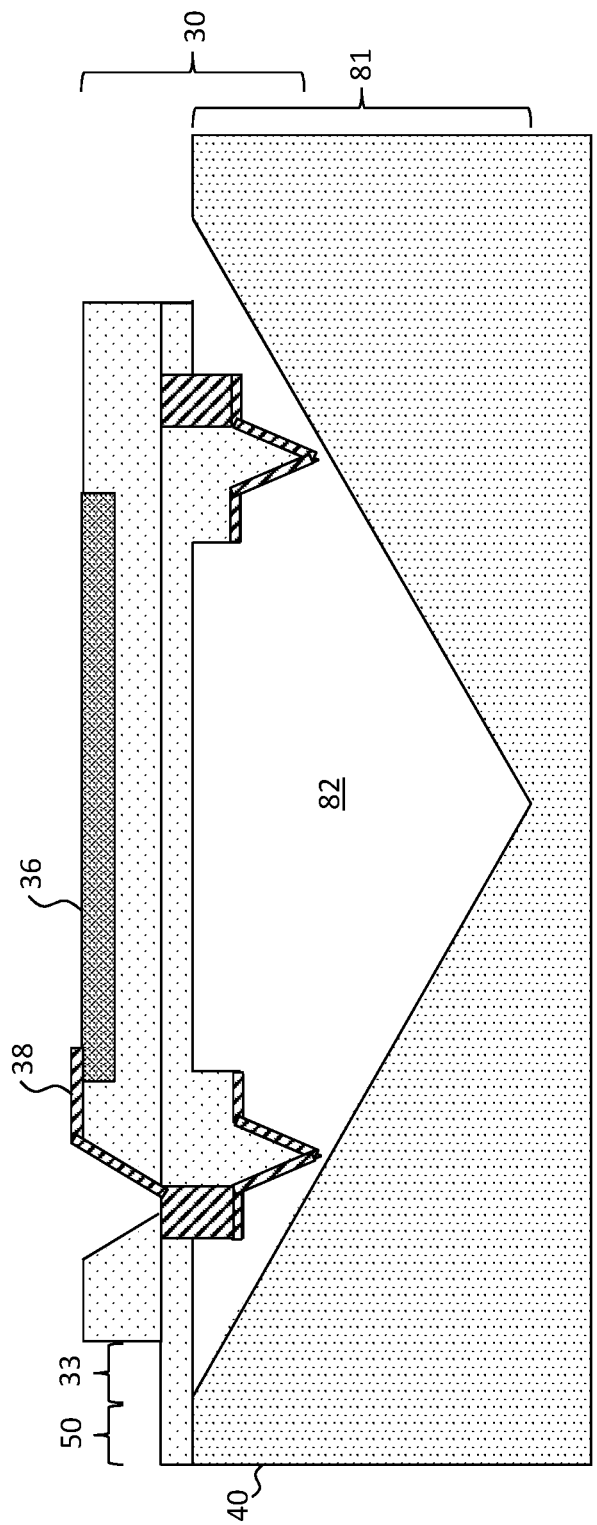
Figure 7I:
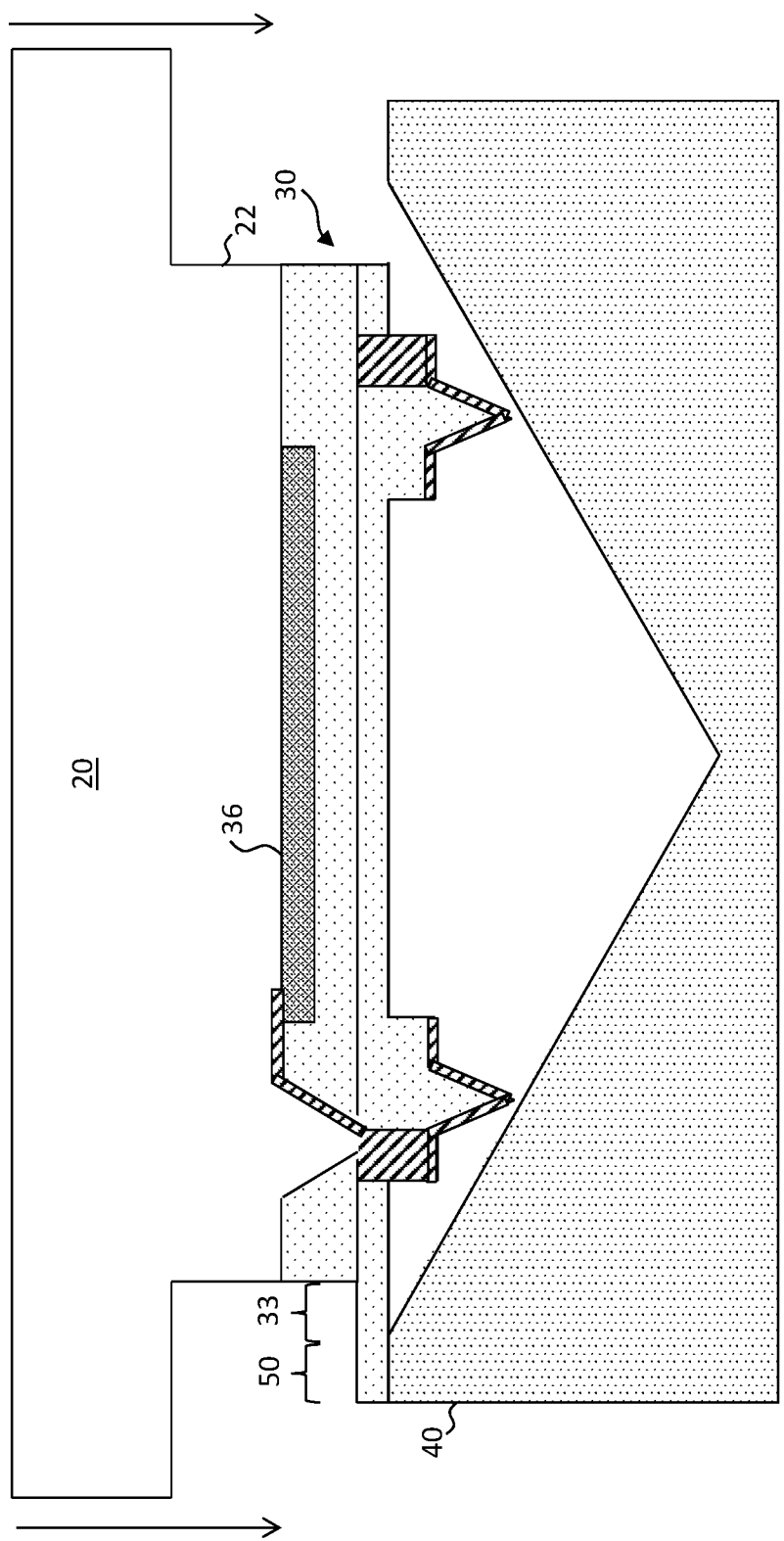
Figure 8G:
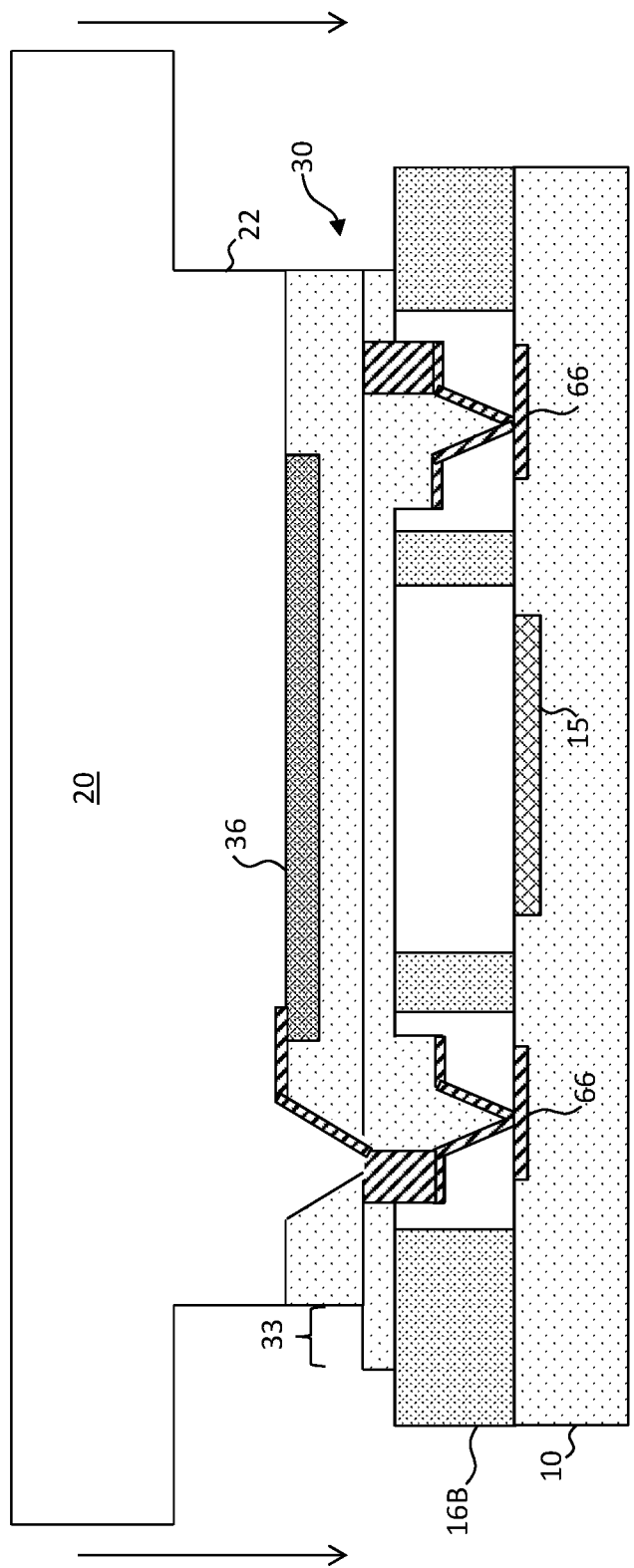
Figure 8J:
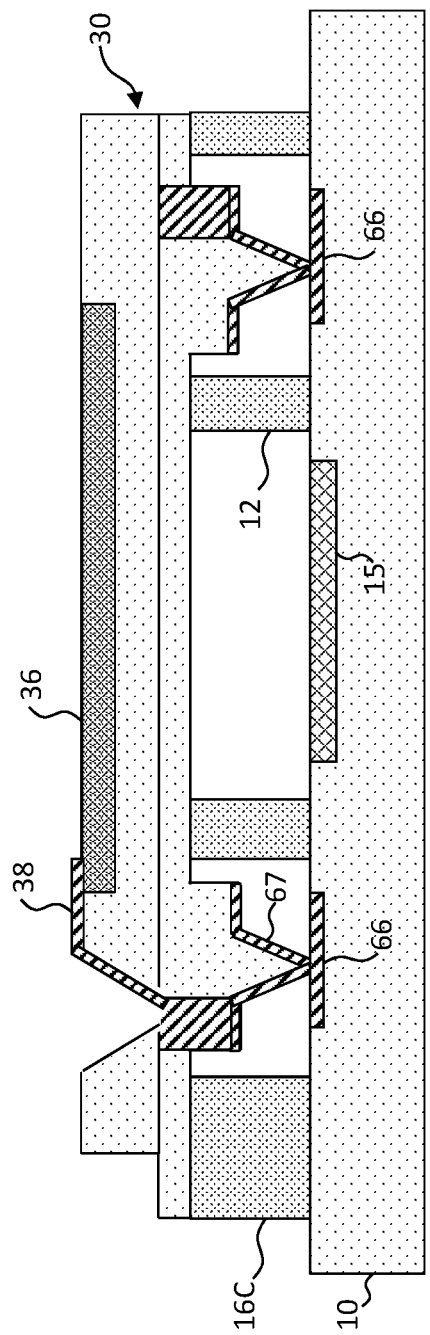
Figure 9:
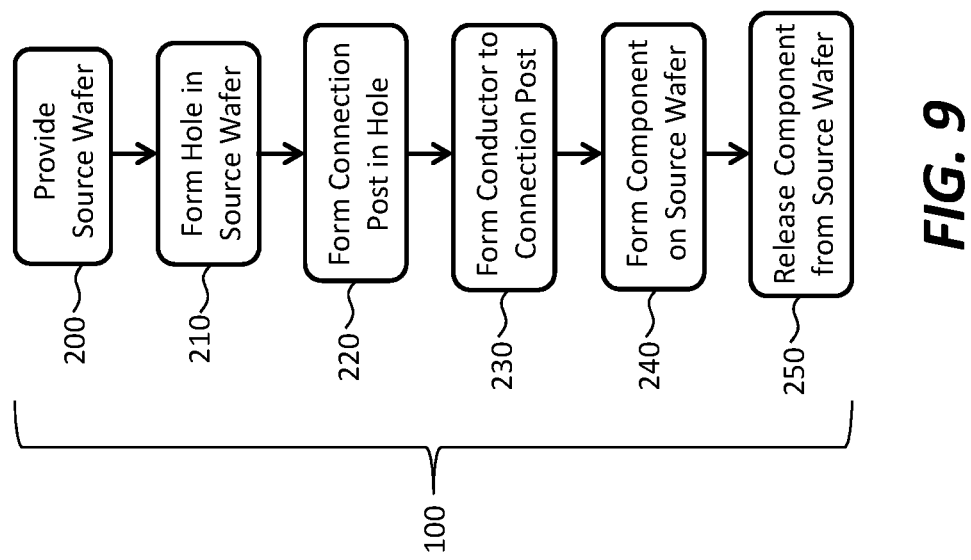
FIGS. 9 and 10 are flow diagrams of construction methods according to illustrative embodiments of the present disclosure.
Figure 10:
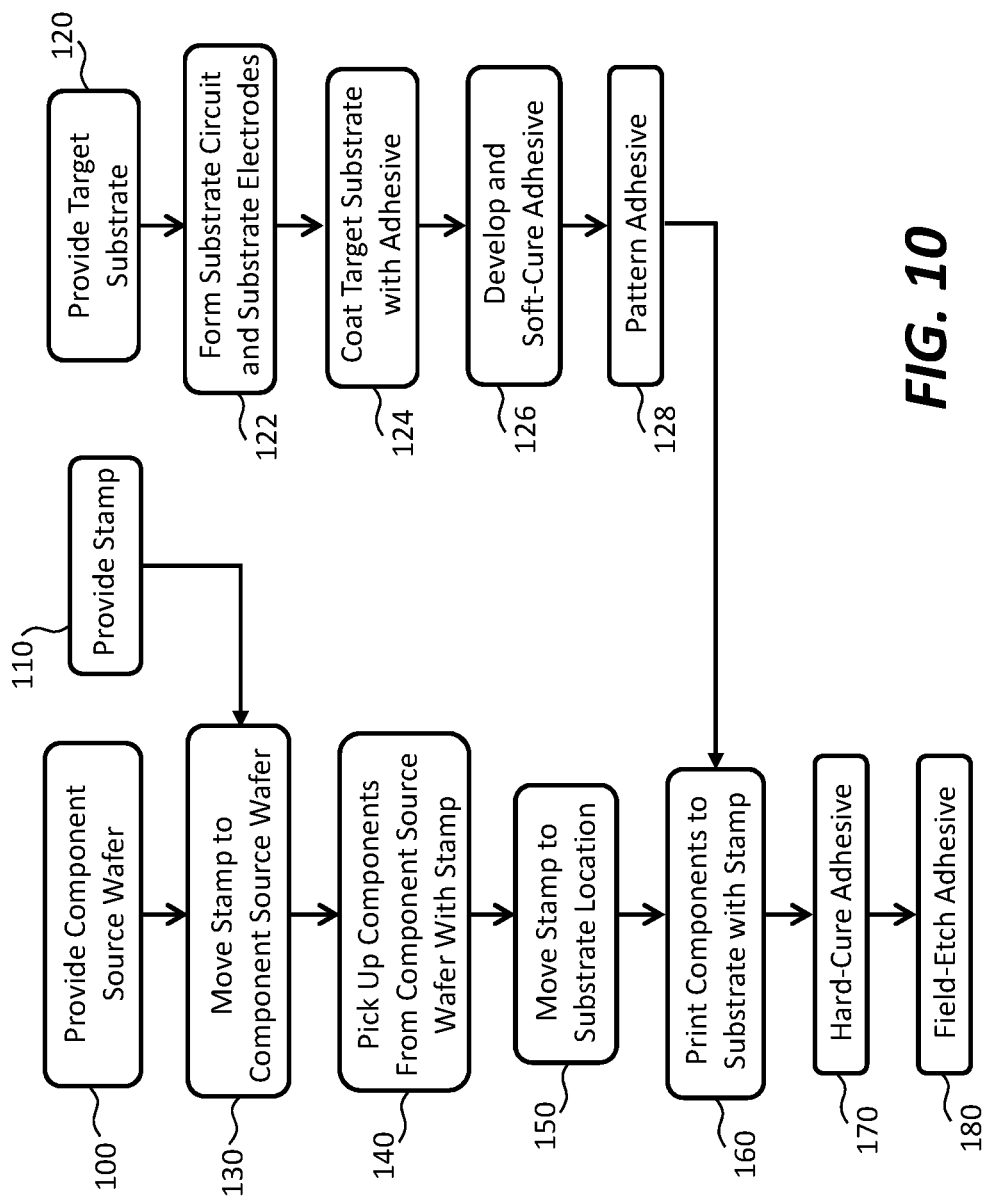

A method of making a printed structure according to embodiments of the present disclosure is illustrated in the successive cross sections of FIGS. 7A-7J, 8A-8J, and the flow diagrams of FIGS. 9 and 10. FIGS. 7A-7J illustrate the construction of component 30 according to the method illustrated in FIG. 10 and FIGS. 8A-8J illustrate the construction of substrate 10 and the assembly of component 30 with substrate 10, according to embodiments of the present disclosure.

As shown in FIG. 9, in step 100 a component source wafer 40 with components 30 is provided. First and as shown in FIG. 7A, a source wafer (e.g., a semiconductor source wafer such as silicon) is provided in step 200. Holes, trenches, pits or other indentations are formed in component source wafer 40 as shown in FIG. 7B in step 210, for example by etching component source wafer 40 with an isotropic etch through a mask, for example a dry etch such as $CF_4$. A connection post 67 is formed in each hole, trench, pit, or other indentation in step 220, for example by an anisotropic etch through a mask to form a pyramidal hole as shown in FIG. 7C, coating and patterning a conductor such as metal in the hole as shown in FIG. 7D, depositing a dielectric layer 44 over the metal to form connection posts 67 as shown in FIG. 7E, patterning dielectric layer 44 to expose silicon component source wafer 40, form a component tether 33, an anchor 50, and vias to connection posts 67, and then provide a conductor in the vias, e.g., as a patterned coating or a plug, in step 230 as shown in FIG. 7F, and then forming the remainder of component 30 (e.g., including a component circuit 36 electrically connected to connection post 67 with component top electrode 38) over dielectric layer 44, in step 240 as shown in FIG. 7G. In some embodiments, the remainder of component 30 is formed without depositing dielectric layer 44.

The construction of component 30, including material deposition and patterning to form connection posts 67, vias, and any integrated circuits and wires in component 30 can be done using photolithographic methods and materials known in the art. As shown in FIG. 7H, in step 250 component 30 is released from component source wafer 40 by anisotropically etching sacrificial portion 82 of sacrificial layer 81 in component source wafer 40, e.g., with trimethylammonium hydroxide (TMAH), so that component 30 is physically attached to anchor 50 by component tether 33 and is suspended over component source wafer 40. Component 30 can then be removed from component source wafer 40 by contacting component 30 with stamp post 22 of stamp 20 to adhere component 30 to stamp post 22 (as shown in FIG. 7I) and then removing stamp 20 with component 30 adhered to stamp post 22 (as shown in FIG. 7J), breaking (e.g., fracturing) or separating component tether 33.

Thus, according to some embodiments of the present disclosure, a component source wafer 40 has a source wafer surface 41 and a hole 42 in component source wafer 40 extending from source wafer surface 41 into component source wafer 40, a connection post 67 disposed in hole 42, and a component 30 disposed over component source wafer 40 and electrically connected to connection post 67. In some embodiments, component source wafer 40 comprises a sacrificial layer 81 over which connection post 67 and component 30 are disposed, sacrificial layer 81 comprising sacrificial portions 82 separated by anchors 50, component 30 physically connected to anchor 50 by a component tether 33. Component 30 and connection post 67 are disposed entirely over and directly above sacrificial portion 82.

Figure 7J:
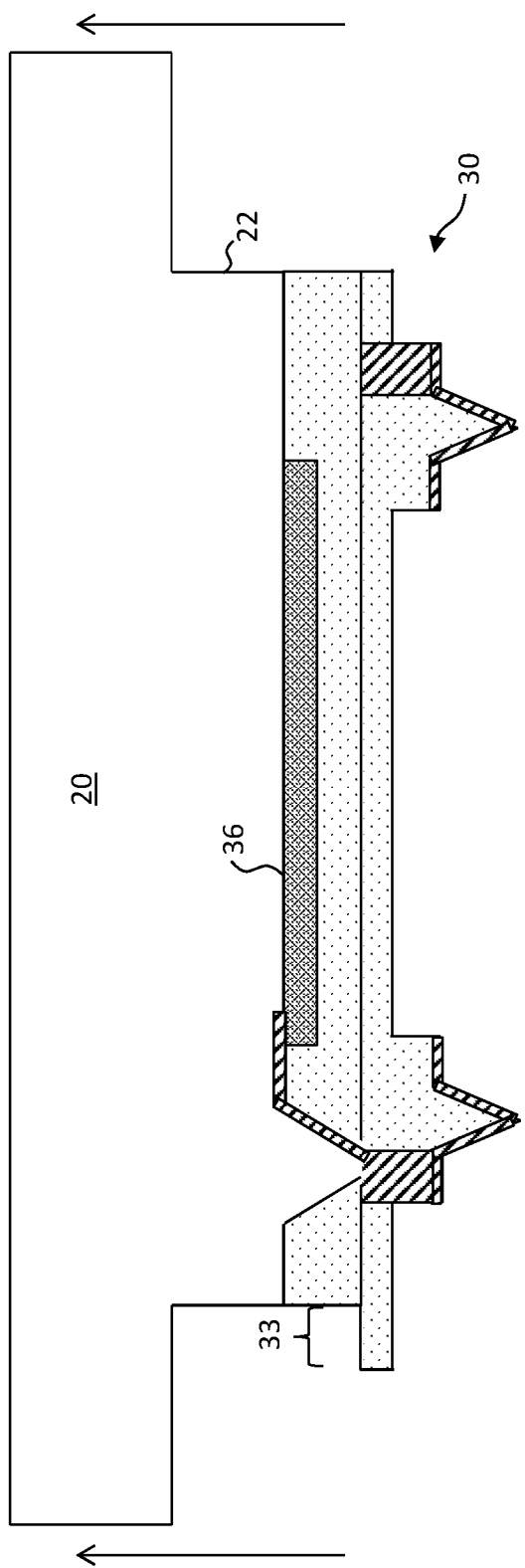

Component 30 as illustrated in FIGS. 7B top 7J corresponds to the printed structure of FIG. 2 and comprises component gap 75A. In some simpler embodiments and corresponding to FIG. 1, the pit, hole, or trench in component source wafer 40 (e.g., as shown in FIG. 7B) is not constructed so that connection posts 67 are formed in the otherwise planar source wafer surface 41. The construction of connection posts 67, component tether 33, and component 30 are otherwise performed as described above and in FIGS. 7C-7 and FIG. 9.

As shown in the successive cross sections of FIGS. 8A-8J and the flow diagram of FIG. 10, once component 30 is constructed in step 100 (and as described in more detail in FIG. 9 and FIGS. 7A-7H), a stamp 20 is provided in step 110, and a substrate 10 (a target substrate) is provided in step 120 as shown in FIG. 8A. Substrate 10 is processed, for example using photolithographic methods and materials, to form substrate electrodes 66 and substrate circuit(s) 15 in step 122 and as shown in FIG. 8B. In step 124, substrate 10 is coated with a liquid adhesive 16A, for example by spin or spray coating, as shown in FIG. 8C, and then soft-cured, for example by drying or heating with a low heat (for example a heat that is not greater than 120, 110, 100, or 90 degrees C.). In some embodiments, soft-cured adhesive 16B can be exposed to electromagnetic radiation 28 through a mask (e.g., a photoresist mask), as shown in FIG. 8D. In some embodiments, exposing liquid adhesive 16A to electromagnetic radiation through a mask soft-cures the adhesive while remaining liquid adhesive 16A (not exposed to electromagnetic radiation due to being covered by the mask) is developed for example by washing with a solvent. Drying or heating with a low heat (for example a heat that is not greater than 120, 110, 100, or 90 degrees C.) can occur after developing and patterning the layer of soft-cured adhesive 16B, as in steps 126-128. Steps 124-128 are shown in FIGS. 8D-8E, which also illustrate exposing substrate circuit 15 and, optionally, substrate electrodes 66.

In some embodiments, substrate posts 12 comprise soft-cured adhesive prior to printing components 30 to substrate 10 by disposing components 30 on substrate posts 12. Hard-curing the adhesive can then occur after the printing, thereby permanently affixing components 30 to substrate posts 12. Substrate posts 12 can be made of adhesive, for example that is both soft- and hard-curable. In some embodiments, substrate posts 12 are uncured prior to printing components 30 thereto and are hard-cured after the printing.

At the same time as or before or after, stamp 20 is moved to component source wafer 40 and contacted to components 30 (in step 130 and as shown in FIG. 7I). Stamp 20 is removed with adhered components 30 (in step 140 and as shown in FIG. 7J), breaking (e.g., fracturing) or separating component tethers 33, and then moved to target substrate 10 (in step 150 and as shown in FIG. 8F) once liquid adhesive 16A is soft-cured to form soft-cured adhesive 16B substrate posts 12. In step 160 and as shown in FIGS. 8F and 8G, components 30 are printed (e.g., micro-transfer printed) to substrate 10 in alignment with substrate circuit 15 and substrate electrodes 66 and stamp 20 is removed as shown in FIG. 8H. Substrate posts 12 are hard cured in step 170 as shown in FIG. 8I, for example with heat at a temperature greater than was used for soft-curing in step 126, if heat was used for soft-curing. Optionally, any exposed hard-cured adhesive 16C is removed, for example with a field-etch in step 180 and as shown in FIG. 8J.

Thus, according to embodiments of the present disclosure, a method of making a printed structure with a gap 75 comprises providing (i) a component source wafer 40 comprising components 30 and (ii) a transfer device (e.g., a stamp 20, such as an elastomeric stamp), providing a substrate 10 with a substrate circuit 15 and substrate posts 12 made of soft-cured adhesive 16B extending from a substrate surface 11 of substrate 10 exterior to substrate circuit 15, picking up components 30 from component source wafer 40 by adhering components 30 to a transfer device (e.g., stamp 20), printing the picked-up components 30 to substrate 10 by disposing picked-up component 30 onto substrate post 12, and hard-curing substrate post 12 thereby providing one or more printed components 30 in a printed structure with air gap 75 over substrate circuit 15. In some embodiments, methods of the present disclosure comprise releasing component 30 and connection post 67 from component source wafer 40 so that component 30 is suspended over component source wafer 40 by component tether 33 attached to anchor 50, before micro-transfer printing.

Figure 11:
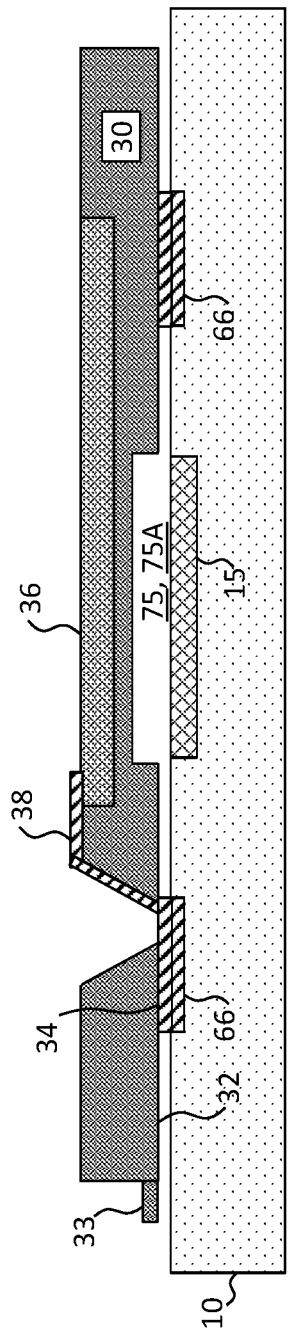
FIGS. 11 and 12 are cross sections of printed structures with air gaps according to illustrative embodiments of the present disclosure.
Figure 12:
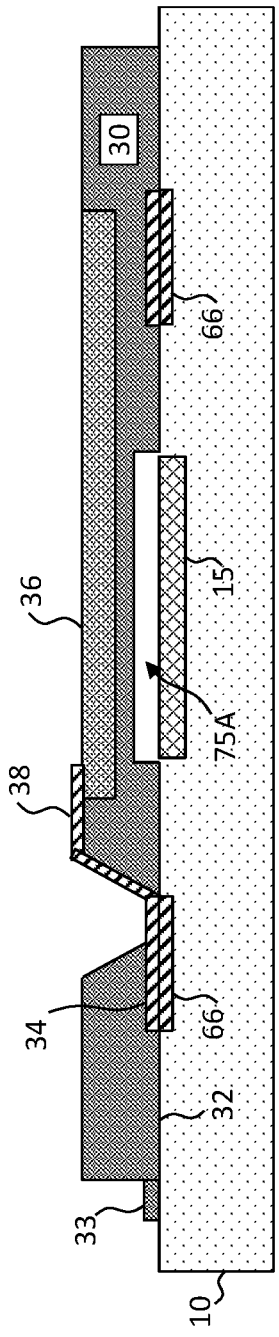

According to some embodiments of the present disclosure, an air gap 75 is provided between component 30 and substrate circuit 15 without substrate posts 12. As shown in FIGS. 11 and 12, component electrodes 34 are provided on component 30 in the place of connection posts 67 but are otherwise electrically connected in the same way as connection posts 67. Component 30 is printed (e.g., micro-transfer printed) from component source wafer 40 to substrate 10. As shown in FIG. 11, component electrode 34 has a flat surface on component bottom surface 32 and stands off component 30 from substrate 10 to provide air gap 75 between component bottom side 32 of component 30 and substrate circuit 15. Component air gap 75A can enlarge air gap 75, as shown. As shown in FIG. 12, component electrode 34 has a flat surface on component bottom surface 32 in contact with substrate electrode 66 and does not stand off component 30 from substrate 10. Component air gap 75A separates component 30 from substrate circuit 15.

Thus, according to embodiments of the present disclosure, a printed structure comprises a substrate 10 comprising a substrate surface 11, a substrate circuit 15 disposed in or on in a circuit area of substrate surface 11, a substrate electrode 15 disposed on substrate surface 11, a component 30 having a component top side 31 and a component bottom side 32 opposite component top side 31, component 30 having a component air gap 75A (component cavity) disposed in component bottom side 32, wherein component 30 is disposed on substrate surface 11, a component electrode 34 (component contact pad 34) disposed on component bottom side 32 and in electrical contact with substrate electrode 66, wherein component cavity 75A forms an air gap 75 between component bottom side 32 and substrate circuit 15. At least a portion of component bottom side 32 can be in contact with at least a portion of substrate surface 11.

Reference is made throughout the present description to examples of micro-transfer printing with stamp 20 when describing certain examples of printing components 30. Similar other embodiments are expressly contemplated where a transfer device 20 that is not a stamp 20 is used to similarly print components 30. For example, in some embodiments, a transfer device 20 that is a vacuum-based or electrostatic transfer device 20 can be used to print components 30. A vacuum-based or electrostatic transfer device 20 can comprise a plurality of transfer posts, each transfer post being constructed and arranged to pick up a single component 30 (similarly to stamp posts 22 in stamp 20).

According to some embodiments, micro-transfer printing can include any method of transferring components 30 from a source substrate (e.g., component source wafer 40) to a destination substrate (e.g., substrate 10) by contacting components 30 on component source wafer 40 with a patterned or unpatterned stamp surface of a stamp 20 to remove components 30 from the component source wafer 40, transferring stamp 20 and contacted components 30 to the destination substrate 10, and contacting components 30 to a surface of substrate 10. Components 30 can be adhered to stamp 20 or substrate 10 by, for example, van der Waals forces, electrostatic forces, magnetic forces, chemical forces, adhesives, or any combination of the above. In some embodiments, components 30 are adhered to stamp 20 with separation-rate-dependent adhesion, for example kinetic control of viscoelastic stamp materials such as can be found in elastomeric transfer devices such as a PDMS stamp 20. Stamps 20 can be patterned or unpatterned and can comprise stamp posts 22 having a stamp post 22 area on the distal end of stamp posts 22. Stamp posts 22 can have a length, a width, or both a length and a width, similar or substantially equal to a length, a width, or both a length and a width of component 30. In some embodiments, as discussed further below, stamp posts 22 can be smaller than components 30 or have a dimension, such as a length and/or a width, substantially equal to or smaller than a length or a width of substrate posts 12 in one or two orthogonal directions. In some embodiments, stamp posts 22 each have a contact surface of substantially identical area.

In exemplary methods, a viscoelastic elastomer (e.g., PDMS) stamp 20 (e.g., comprising a plurality of stamp posts 22) is constructed and arranged to retrieve and transfer components 30 from their native component source wafer 40 onto non-native substrates 10. In some embodiments, stamp 20 mounts onto motion-plus-optics machinery (e.g., an opto-mechatronic motion platform) that can precisely control stamp 20 alignment and kinetics with respect to both component source wafers 40 and patterned substrates 10 with substrate posts 12. During micro-transfer printing, the motion platform brings stamp 20 into contact with components 30 on component source wafer 40, with optical alignment performed before contact. Rapid upward movement of the print-head (or, in some embodiments, downward movement of component source wafer 40) breaks (e.g., fractures) or separates component tether(s) 33 forming broken (e.g., fractured) or separated component tethers 33, transferring component(s) 30 to stamp 20 or stamp posts 22. The populated stamp 20 then travels to patterned substrate 10 (or vice versa) and one or more components 30 are then aligned to substrate posts 12 and printed.

Sacrificial portions 82 (shown in FIG. 7H) are sacrificed, for example by etching sacrificial portions 82 to form gaps, so that components 30 are suspended over component source wafer 40 and attached to anchors 50 of component source wafer 40 by component tethers 33 that maintain the physical position of components 30 relative to (e.g., with respect to) component source wafer 40 after sacrificial portions 82 are etched. (Components 30 are said to comprise at least a portion of a component tether 33, which may break or separate during a pick-up portion of a printing.) Stamp 20 is moved into position relative to component source wafer 40, for example by an opto-mechatronic motion platform and components 30 are picked up from component source wafer 40 by adhering components 30 to stamp 20, for example by pressing stamp 20 against components 30 on component source wafer 40 with the motion platform and adhering components 30 to the distal ends of stamp posts 22, for example with van der Waals or electrostatic forces.

A component source wafer 40 can be any source wafer or substrate with transfer printable components 30 that can be transferred with a transfer device 20 (e.g., a stamp 20). For example, a component source wafer 40 can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions 82 can be formed of a patterned oxide (e.g., silicon dioxide) or nitride (e.g., silicon nitride) layer or can be an anisotropically etchable portion of sacrificial layer 81 of component source wafer 40. Typically, component source wafers 40 are smaller than patterned substrates 10.

Components 30 can be any transfer printable structure, for example including any one or more of a wide variety of active or passive (or active and passive) components 30. Components 30 can be any one or more of integrated devices, integrated circuits (such as CMOS circuits or radiofrequency (RF) circuits), light-emitting diodes, photodiodes, sensors, electrical or electronic devices, optical devices, opto-electronic devices, magnetic devices, magneto-optic devices, magneto-electronic devices, and piezo-electric device, materials or structures. Components 30 can comprise electronic component circuits that operate component 30. Component 30 can be responsive to electrical energy, to optical energy, to electromagnetic energy, or to mechanical energy, for example. In some embodiments, an acoustic wave transducer 94 comprises component 30. In some embodiments, two acoustic wave transducers 94 both comprise component 30, for example when used in an acoustic wave filter or sensor. Components 30 can be RF circuits.

Components 30 formed or disposed in or on component source wafers 40 can be constructed using integrated circuit, micro-electro-mechanical, or photolithographic methods for example. Components 30 can comprise one or more different component materials, for example non-crystalline (e.g., amorphous), polycrystalline, or crystalline semiconductor materials such as silicon or compound semiconductor materials or non-crystalline or crystalline piezo-electric materials. In some embodiments, component 30 comprises a layer of piezo-electric material disposed over or on a layer of dielectric material, for example an oxide or nitride such as silicon dioxide or silicon nitride.

In certain embodiments, components 30 can be native to and formed on sacrificial portions 82 of component source wafers 40 and can include seed layers for constructing crystalline layers on or in component source wafers 40. Components 30, sacrificial portions 82, anchors 50, and component tethers 33 can be constructed, for example using photolithographic processes. Components 30 can be microdevices having at least one of a length and a width less than or equal to 200 microns, less than or equal to 100 microns, less than or equal to 50 microns, less than or equal to 25 microns, less than or equal to 15 microns, less than or equal to 10 microns, or less than or equal to five microns, and alternatively or additionally a thickness of less than or equal to 50 microns, less than or equal to 25 microns, less than or equal to 15 microns, less than or equal to 10 microns, less than or equal to five microns, less than or equal to two microns, or less than or equal to one micron. Components 30 can be unpackaged dice (each an unpackaged die) transferred directly from native component source wafers 40 on or in which components 30 are constructed to patterned substrate 10.

Anchors 50 and component tethers 33 can each be or can comprise portions of component source wafer 40 that are not sacrificial portions 82 and can include layers formed on component source wafers 40 or component 30, for example dielectric or metal layers and for example layers formed as a part of photolithographic processes used to construct or encapsulate components 30.

Substrate 10 can be any destination substrate or target substrate with substrate posts 12 to which components 30 are transferred (e.g., micro-transfer printed), for example flat-panel display substrates, printed circuit boards, or similar substrates can be used in various embodiments. Patterned substrates 10 can be, for example substrates comprising one or more of glass, polymer, quartz, ceramics, metal, and sapphire. Patterned substrates 10 can be semiconductor substrates (for example silicon) or compound semiconductor substrates.

In some embodiments, a layer of adhesive 16, such as a layer of resin, polymer, or epoxy, comprised in substrate posts 12 adheres components 30 onto substrate posts 12 of patterned substrate 10 and can be disposed, for example by coating or lamination. For example, substrate posts 12 can comprise a rigid dielectric with a curable adhesive disposed on the rigid dielectric. In some embodiments, a layer of adhesive 16 is disposed in a pattern. A layer of adhesive 16 can be disposed using inkjet, screening, or photolithographic techniques, for example. In some embodiments, a layer of adhesive 16 is coated, for example with a spin, spray, or slot coater, and then patterned, for example using photolithographic techniques. A patterned layer of adhesive 16 can provide substrate posts 12, for example by coating and imprinting or photolithographic processing or by inkjet deposition. In some embodiments, solder is pattern-wise coated and disposed component electrodes 34, for example by screen printing, and improves an electrical connection between a component 30 and an electrical conductor such as substrate electrode 66.

In some embodiments, a substrate post 12 is any protuberance or protrusion extending from a substrate surface 11 of patterned substrate 10. In some embodiments, substrate posts 12 have a substantially rectangular cross section. In some embodiments, substrate posts 12 have non-rectangular cross sections, such as circular or polygonal cross sections for example, or circular or rectangular rings. In some embodiments, substrate posts 12 have a flat surface on a distal end of each substrate post 12 in a direction parallel to substrate surface 11, e.g., can be a mesa. In some embodiments, substrate posts 12 can comprise any material to which components 30 can be adhered. A substrate post 12 can be a pedestal or post and can comprise the same material as patterned substrate 10 or can comprise a different material from substrate 10 or component 30. For example, in some embodiments, substrate posts 12 are patterned in substrate 10, for example by patterned etching using photoresists and other photolithographic processes, stamping, or molding. In some embodiments, substrate posts 12 are formed on substrate 10 (e.g., by coating). In some embodiments, substrate posts 12 comprise different materials from substrate 10, for example by coating a material in a layer on substrate 10 and pattern-wise etching the coated layer to form substrate posts 12.

For example, substrate posts 12 can be a cured resin and can be deposited in an uncured state and soft-cured or patterned before components 30 are micro-transfer printed to substrate posts 12 or hard-cured after components 30 are micro-transfer printed to substrate posts 12. Substrate posts 12 can be formed using photolithographic processes, for example substrate posts 12 can be formed by coating a resin over a substrate and then patterning and curing the resin using photolithographic processes (e.g., coating a photoresist, exposing the photoresist to patterned radiation 28, curing the photoresist, etching the pattern to form substrate posts 12 and patterned substrate 10, and stripping the photoresist). Substrate posts 12 can be constructed by inkjet deposition or imprinting methods, for example using a mold, and can be imprinted structures.

Patterned electrical conductors (e.g., wires, traces, or electrodes (e.g., electrical contact pads) such as those found on printed circuit boards, flat-panel display substrates, and in thin-film circuits) can be formed on any combination of components 30 and substrate 10, and any one can comprise electrodes (e.g., electrical substrate or component contact pads 66, 34) that electrically connect to components 30, for example as described above. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on substrate 10 or components 30, or both.

Substrate posts 12 can, in general, be arranged in any desired pattern, including, for example, polygons curves, circles, or a random arrangement exterior to substrate circuit 15.

In some embodiments, components 30 are adhered to a stamp post 22 of a stamp 20 and transferred to a substrate post 12, for example by van der Waals forces. The adhesion between a component 30 and a surface of stamp post 22 can be dependent, at least in part, on the area of component 30 that is in contact with stamp post 22, for example a distal end of stamp post 22. Similarly, the adhesion between a surface of a substrate post 12 and a component 30 micro-transfer printed to substrate post 12 can be dependent, at least in part, on the area of component 30 that is in contact with substrate post 12, for example a distal end of substrate post 12. In some embodiments, in order to micro-transfer print a component 30 from a stamp post 22 to a substrate post 12, an adhesion between component 30 and substrate post 12 must be greater than an adhesion between component 30 and stamp post 22. Thus, it can be helpful if the area of substrate post 12 surface to which component 30 is micro-transfer printed is at least as large, or larger than, the area of stamp post 22 from which component 30 is micro-transfer printed.

Adhesive 16 of substrate post 12 can be a curable or cured adhesive 16. Adhesive 16 of substrate post 12 can be an uncured adhesive 16 that is subsequently cured. Uncured adhesive 16 can be an uncured adhesive 16 that is deposited on substrate surface 11 of substrate 10 as a liquid, for example by laminating, coating, or spraying adhesive 16 onto substrate surface 11 of substrate 10. Adhesive 16 can be a soft-cured adhesive 16B, for example an adhesive 16 from which at least some, a majority, or a substantial majority of solvents or other volatile materials are evaporated or otherwise removed or driven out from uncured adhesive 16 that is still relatively malleable, compliant, or conformable compared to a hard-cured adhesive 16 and can be shaped or otherwise deformed by pressing against the soft-cured adhesive 16B, for example with a component 30. An uncured or soft-cured adhesive 16 can be hard cured by, for example, by heating or exposure to electromagnetic radiation 28 that renders adhesive 16 a cured, relatively rigid, non-compliant, non-conformable, and solid adhesive 16 with substantially reduced stickiness or adhesion compared to uncured or soft-cured adhesive 16. Thus, in some embodiments, adhesive 16 can be completely uncured, soft-cured, or hard-cured at various stages of constructing printed structures 99 of the present disclosure. A layer of soft-cured (e.g., partially cured) adhesive 16 can be patterned, for example by photolithographic processing using masks to expose the layer of uncured adhesive 16 and removing either the exposed or unexposed adhesive 16 to form a patterned layer of soft-cured adhesive 16B on substrate 10 and rendering substrate 10 a patterned substrate 10.

According to embodiments of the present disclosure, adhesive 16 can comprise an organic material, a polymer, a resin, or an epoxy. According to some embodiments, adhesive 16 is a photoresist. According to some embodiments, adhesive 16 is a positive photoresist. As is well known in the photolithographic arts, a positive photoresist is a photoresist that, when disposed on a substrate (e.g., substrate 10) and exposed to appropriate illumination (e.g., ultra-violet, infrared, or visible light), at least partially breaks down and can be washed away. Therefore, a patterned exposure (e.g., through a mask) and washing of a layer of positive photoresist will remove portions of the layer that are exposed and portions of the layer that are not exposed are left in place, for example on substrate 10. Thus, masked exposure of a layer of positive photoresist to radiation 28 will chemically transform the exposed portions of the layer so it can be washed away and will not chemically process the unexposed portions of the layer that remains on substrate 10, so that the soft-cured positive photoresist will largely maintain its adhesive properties.

In contrast, a negative photoresist, when disposed on a substrate and exposed to appropriate illumination (e.g., ultra-violet, infrared, or visible light) is solidified and cannot be easily washed away. Therefore, a patterned exposure (e.g., through a mask) and washing of a layer of negative photoresist will remove portions of the layer that are not exposed and portions of the layer that are exposed are left in place, the opposite response to masked exposure of a positive photoresist. Thus, masked exposure of a layer of negative photoresist to radiation 28 will chemically transform the exposed portions of the layer that remain in place without chemically processing the unexposed portions of the layer that can be washed away. The chemical transformation of the exposed portions of negative photoresist can render the exposed portion less adhesive.

Accordingly, the portion of a layer of positive photoresist layer that remains on substrate 10 after patterning is not chemically processed and therefore remains relatively deformable, compliant, conformable, and sticky (adhesive), as in its soft-cured state. In contrast, the portion of a negative photoresist layer that remains on substrate 10 after patterning is chemically processed and rendered much more solid, inflexible, and less adhesive. Therefore, patterned positive photoresist is more adhesive, compliant, and conformable than patterned negative photoresist and component 30 can be micro-transfer printed onto a substrate post 12 comprising a patterned positive photoresist adhesive 16 much more effectively than component 30 can be micro-transfer printed onto a substrate post 12 comprising a patterned negative photoresist. After micro-transfer printing component 30 onto patterned positive photoresist adhesive 16, patterned positive photoresist adhesive 16 can be cured (e.g., hard cured with heat or radiation 28) to robustly affix component 30 to substrate post 12 (cured patterned positive photoresist adhesive 16).

Components 30 micro-transfer printed onto substrate post 12 on substrate 10 can be electrically connected to conductors or other electrical devices disposed on substrate 10. In some embodiments, electrical connections between components 30 and substrate electrodes 66 are made with connection posts 67 that are electrically connected to component circuits and extend from components 30. When components 30 are disposed on substrate posts 12, substrate posts 12 can have a height that is comparable to the height of connection posts 67, for example equal to or slightly less than the height of connection posts 67, e.g., within 5%, 10%, 15%, 20%, or 25% of the height of connection posts 67 extending from component 30. When substrate posts 12 have a height that is slightly less than the height of connection posts 67, either before or after curing patterned adhesive 16 making up substrate posts 12, connection posts 67 can make contact with contact pads disposed on substrate 10 (e.g., make contact with substrate electrodes 66). In some embodiments, connection posts 67 can be in contact with substrate electrodes 66 after micro-transfer printing component 30 to patterned adhesive 16 substrate posts 12, for example in contact with, extend into, or pierce substrate electrodes 66, but before curing adhesive 16. In some embodiments, connection posts 67 can be in contact with substrate electrodes 66 after micro-transfer printing component 30 to patterned adhesive 16 substrate posts 12, for example in contact with, extend into, or pierce substrate electrodes 66, after curing adhesive 16. The cure process for adhesive 16 can shrink adhesive 16, for example by 10%-25% or by 15%-20%, pulling component 30 closer to and in more robust contact with substrate 10 and pulling connection posts 67 into firmer physical and electrical contact with substrate electrodes 66 so that component 30 is held in compression against substrate 10 and component 30 is held in electrical contact with substrate electrodes 66 through connection posts 67. Thus, providing (e.g., hard-cured) substrate posts 12 having a height equal to or less than a height of connection posts 67 can enable or improve an electrical connection between component 30 (e.g., connection post 67) and substrate electrodes 66 on substrate 10. In some embodiments, substrate post 12 has a height greater than or equal to a height of connection posts 67 when uncured or soft-cured and subsequently a smaller height that is less than or equal to a height of connection posts 67 after hard curing.

According to some embodiments of the present disclosure, electrical connections between connection posts 67 and substrate electrodes 66 are enhanced by ensuring that adhesive 16 between component 30 and substrate 10 is disposed only between connection posts 67 on substrate 10 and is not in contact with connection posts 67, e.g., none of adhesive 16 is disposed on substrate electrodes 66. Thus, when connection posts 67 are pressed onto and into substrate electrodes 66, there is no adhesive 16 present to obstruct or interfere with an electrical connection between connection posts 67 and substrate electrodes 66, improving the electrical connection between connection posts 67 and substrate electrodes 66.

According to some embodiments of the present disclosure, solder can be disposed on substrate electrodes 66. Solder can coat substrate electrodes 66 and can coat connection posts 67, for example after heating the solder to reflow so that the solder wicks along a surface of substrate electrodes 66 and connection posts 67 in contact with the solder. Solder can be reflowed in a common step with hard-curing patterned adhesive 16 to cure substrate posts 12 so that an electrical connection between connection posts 67 and substrate electrodes 66 is created, enabled, or enhanced.

In some embodiments of the present disclosure, component 30 comprises a broken (e.g., fractured) or separated component tether 33, for example as a consequence of micro-transfer printing component 30 from a component source wafer 40 to substrate post 12 of substrate 10.

Adhesive 16 can be a positive photoresist, for example AZ1505 or AZ10XT from Microchemicals GmbH. Patterned substrate 10 can be provided in step 120 using photolithographic materials and methods known in the art.

According to embodiments of the present disclosure, when component 30 is printed onto substrate posts 12 (patterned soft-cured adhesive layer 16B), the soft-cured adhesive 16B changes its shape and can bulge outward from its original position and can, for example, come into contact with substrate contact pads 66 (substrate electrodes 66). If the volume of soft-cured adhesive 16B is too large, soft-cured adhesive 16B can come into contact with (e.g., between) substrate contact pads 66 and connection posts 67 and inhibit an electrical contact between substrate contact pads 66 and connection posts 67. This undesirable consequence can be avoided by reducing the volume of soft-cured adhesive 16B on substrate 10 (while still enabling contact with component 30 during printing) and disposing soft-cured adhesive 16B sufficiently far from connection posts 67.

Furthermore, under pressure from component 30, soft-cured adhesive layer 16B can be pressed onto and over a portion of substrate contact pads 66, but without coming between connection posts 67 and substrate contact pads 66. In some embodiments, connection posts 67 have a substantially planar or flat distal end (the end farthest away from component 30) and leaving at least some portions of substrate contact pads 66 (substrate electrodes 66) free from adhesive layer 16 (and free from substrate posts 12) can enhance the electrical connection between substrate contact pads 66 and connection posts 67. To help prevent patterned adhesive layer 66 from undesirably coating too much of substrate contact pads 66, according to some such embodiments, the area of a cross section of substrate post 12 between component 30 and substrate 10 is less than an area of a cross section bounded by component 30, substrate posts 12, and connection posts 67.

According to some embodiments, electrical connection between connection posts 67 and substrate electrodes 66 are enhanced by a non-directional metal deposition such as by chemical vapor, electroless plating, or electroplating. In some embodiments, substrate contact pads 66 (substrate electrodes 66) on patterned substrate 10 can be wave soldered after hard curing to form or improve an electrical connection between substrate electrodes 66 and connection posts 67. Exposed hard-cured adhesive 16C can be removed for example by a reactive plasma or organic material dry etch, such as an oxygen plasma (e.g., in step 180 of FIG. 10).

In some conventional practices, a soft-cured adhesive 16B is soft cured by exposure to elevated temperatures (e.g., greater than room temperature but less than a hard-cure temperature) or to radiation 28. In some embodiments, lengthy exposure to room temperature or ambient temperature can also soft cure adhesive layer 16.

Examples of micro-transfer printing processes suitable for disposing components 30 onto patterned substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety. In some embodiments, any one or more of component 30, module 98, printed structure 99 (e.g., including an acoustic wave transducer 94) is a compound micro-assembled structure (e.g., a compound micro-assembled macro-system).

According to various embodiments, component source wafer 40 can be provided with components 30, patterned sacrificial portions 82, component tethers 33, and anchors 50 already formed, or they can be constructed as part of a method in accordance with certain embodiments. Component source wafer 40 and components 30, micro-transfer printing device (e.g., a stamp 20), and substrate 10 can be made separately and at different times or in different temporal orders or locations and provided in various process states.

The spatial distribution of any one or more of components 30, substrate circuits 15, and substrate electrodes 66 is a matter of design choice for the end product desired. The figures generally illustrate a single component 30 printed onto substrate 10. However, various printing techniques, such as micro-transfer printing, are amenable to printing large arrays of components at once. Therefore an array (e.g., regular array) of printed structures can be formed by simultaneously printing multiple (e.g., many) components 30, either on a common substrate 10 or an array of substrates 10. (In some embodiments, substrate posts 12 for each printed structure can be formed simultaneously by a large-scale deposition and patterning of an adhesive layer.) Substrate 10 can be a module substrate, for example, where components 30 are printed to an array of substrates 10 disposed on a module source wafer. Modules that include arrays of printed structures as disclosed herein can then be incorporated elsewhere, for example, in some embodiments by singulation and dicing, in some embodiments by packaging and surface-mounting (with surface mount technology), or in some embodiments by micro-transfer printing the modules with a transfer device (e.g., elastomeric stamp). For example, modules can be printed to a destination substrate or incorporated into a ribbon or thread or document.

Because components 30, in certain embodiments, can be made using integrated circuit photolithographic techniques having a relatively high resolution and cost and substrate 10, for example a printed circuit board, can be made using printed circuit board techniques having a relatively low resolution and cost, electrical conductors and substrate electrodes 66 on substrate 10 can be much larger than electrical contacts, electrical conductors, component electrodes 34, component top electrodes 38 on component 30, thereby reducing manufacturing costs. For example, in certain embodiments, micro-transfer printable component 30 has at least one of a width, length, and height from 0.5 μm to 200 μm (e.g., 0.5 to 2 μm, 2 to 5 μm, 5 to 10 μm, 10 to 20 μm, 20 to 50 μm, or 50 to 100 μm, or 100 to 200 μm).

In certain embodiments, patterned substrate 10 is or comprises a member selected from the group consisting of polymer (e.g., plastic, polyimide, PEN, or PET), resin, metal (e.g., metal foil) glass, a semiconductor, and sapphire. In certain embodiments, a substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 30, in certain embodiments, can be constructed using foundry fabrication processes used in the art. Layers of materials can be used, including materials such as metals, oxides, nitrides and other materials used in the integrated-circuit art. Each component 30 can be or include a complete semiconductor integrated circuit and can include, for example, any combination of one or more of a transistor, a diode, a light-emitting diode, and a sensor. Components 30 can have different sizes, for example, at least 100 square microns, at least 1,000 square microns, at least 10,000 square microns, at least 100,000 square microns, or at least 1 square mm. Alternatively or additionally, components 30 can be no more than 100 square microns, no more than 1,000 square microns, no more than 10,000 square microns, no more than 100,000 square microns, or no more than 1 square mm, for example. Components 30 can have variable aspect ratios, for example between 1:1 and 10:1 (e.g., 1:1, 2:1, 5:1, or 10:1). Components 30 can be rectangular or can have other shapes, such as polygonal or circular shapes for example.

Various embodiments of structures and methods were described herein. Structures and methods were variously described as transferring components 30, printing components 30, or micro-transferring components 30. Micro-transfer-printing involves using a transfer device (e.g., an elastomeric stamp 20, such as a PDMS stamp 20) to transfer a component 30 using controlled adhesion. For example, an exemplary transfer device can use kinetic or shear-assisted control of adhesion between a transfer device and a component 30. It is contemplated that, in certain embodiments, where a method is described as including micro-transfer-printing a component 30, other analogous embodiments exist using a different transfer method. As used herein, transferring a component 30 (e.g., from a component source substrate or wafer 40 to a target or destination substrate 10) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a component 30.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact). In some embodiments, a component 30 has connection posts 67 extending therefrom and is disposed "on" a substrate 10 or a substrate post 12 with connection posts 67 disposed between substrate 10 or substrate post 12 and component 30.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of embodiments, it will now become apparent to one of skill in the art that other implementations incorporating the concepts of the disclosure may be used. The disclosure has been described in detail with particular reference to certain embodiments thereof, but it will be understood that variations and modifications can be effected within the spirit and scope of the following claims.

PARTS LIST

A cross section line
10 substrate/patterned substrate
11 substrate surface
12 substrate post
15 substrate circuit
16 adhesive/adhesive layer
16A liquid adhesive
16B soft-cured adhesive
16C hard-cured adhesive
20 transfer device/stamp
22 stamp post
28 radiation
30 component
31 component top side
32 component bottom side
33 component tether
34 component electrode/component contact pad
36 component circuit
38 component top electrode
40 component source wafer
41 source wafer surface
42 hole
44 dielectric layer
50 anchor
66 substrate electrode/contact pad
67 connection post
67A dummy post
75 gap/air gap
75A component gap/component air gap/component cavity
81 sacrificial layer
82 sacrificial portion
100 provide component source wafer step
110 provide stamp step
120 provide target substrate step
122 form substrate circuit and substrate electrodes step
124 coat target substrate with adhesive step
126 develop and soft-cure adhesive step
128 pattern adhesive step
130 move stamp to component source wafer step
140 pick up components from component source wafer with stamp step
150 move stamp to patterned substrate location step
160 print components to substrate with stamp step
170 hard-cure adhesive step
180 field-etch adhesive step
200 provide source wafer step
210 form hole in source wafer step
220 form connection post in hole step
230 form conductor to connection post step
240 form component on source wafer step
250 release component from source wafer step

What is claimed:

1. A printed structure, comprising:
 a substrate comprising a substrate surface;
 a substrate circuit disposed in or on the substrate surface;
 a substrate post protruding from the substrate surface exterior to the substrate circuit, the substrate post comprising a cured adhesive; and
 a component having a component top side and a component bottom side opposite the component top side, the component bottom side disposed on the substrate post thereby adhering the component to the substrate surface with the substrate post such that a gap is defined between the component bottom side and the substrate circuit,
 wherein the component comprises an integrated circuit electrically connected to the substrate circuit.

2. The printed structure of claim 1, comprising a substrate electrode disposed in or on the substrate surface and wherein the component comprises an electrically conductive connection post extending from the component bottom side toward the substrate and in electrical contact with the substrate electrode.

3. The printed structure of claim 2, wherein the substrate post is exterior to the substrate electrode.

4. The printed structure of claim 2, wherein the substrate post is exterior to the connection post.

5. The printed structure of claim 1, comprising a cavity in the component bottom side that forms a portion of the gap.

6. The printed structure of claim 1, wherein the substrate post comprises soft-cured adhesive.

7. The printed structure of claim 1, wherein the substrate post comprises hard-cured adhesive.

8. The printed structure of claim 2, wherein the cured adhesive at least partially surrounds the connection post.

9. The printed structure of claim 1, wherein the cured adhesive at least partially surrounds the substrate circuit.

10. The printed structure of claim 1, wherein the component comprises a broken or separated component tether.

11. The printed structure of claim 1, wherein the component has (i) a length or width or both no greater than 200 microns, (ii) a thickness no greater than 50 microns, or (iii) both (i) and (ii).

12. The printed structure of claim 2, wherein the substrate electrode is electrically connected to the substrate circuit.

13. The printed structure of claim 1, wherein the cured adhesive comprises an organic material, a polymer, a resin, an epoxy, a positive photoresist, or a negative photoresist.

14. The printed structure of claim 1, wherein the component comprises a dummy post and the adhesive is in contact with the dummy post.

15. The printed structure of claim 1, wherein the gap is under vacuum.

16. The printed structure of claim 1, wherein the gap is filled with a gas.

17. The printed structure of claim 1, further comprising a second adhesive substrate post protruding from the substrate surface exterior to the substrate circuit, the substrate post comprising a cured adhesive.

18. The printed structure of claim 17, wherein the second adhesive substrate post is disposed on an opposing end of the component bottom side of the component from the adhesive substrate post.

19. The printed structure of claim 1, wherein the substrate circuit is an RF circuit.

20. The printed structure of claim 1, wherein the substrate post is disposed outside a perimeter of the substrate circuit.

* * * * *